United States Patent [19]

Wahlstrom

[11] Patent Number: 5,375,086
[45] Date of Patent: Dec. 20, 1994

[54] DYNAMIC CONTROL OF CONFIGURABLE LOGIC

[76] Inventor: Sven E. Wahlstrom, 570 Jackson Dr., Palo Alto, Calif. 94303

[21] Appl. No.: 110,897

[22] Filed: Aug. 24, 1993

Related U.S. Application Data

[63] Continuation of Ser. No. 34,451, Mar. 19, 1993.

[51] Int. Cl.$^5$ .............. H03K 19/173; H03K 3/284
[52] U.S. Cl. .................. 365/149; 365/203; 365/189.05; 365/189.04; 326/49; 327/199; 327/51
[58] Field of Search ............ 307/465, 272.9, 279; 365/189.05, 189.04, 149, 203

[56] References Cited

U.S. PATENT DOCUMENTS

| | | | |
|---|---|---|---|
| 3,593,037 | 7/1971 | Hoff, Jr. | 307/238 |
| 3,955,181 | 5/1976 | Raymond, Jr. | 365/149 |
| 4,366,559 | 12/1982 | Misaizu et al. | 365/205 |
| 4,546,273 | 10/1985 | Osman | 307/468 |
| 4,617,479 | 10/1986 | Hartmann et al. | 307/465 |
| 4,706,216 | 11/1987 | Carter | 365/94 |
| 4,809,230 | 2/1989 | Konishi et al. | 365/203 |
| 4,814,647 | 3/1989 | Tran | 365/203 |
| 4,831,591 | 5/1989 | Imazeki et al. | 365/189.08 |
| 4,907,199 | 3/1990 | Dosaka et al. | 365/189.04 |
| 4,959,564 | 9/1990 | Steele | 307/465 |
| 5,018,105 | 5/1991 | Miyanishi | 365/203 |
| 5,042,004 | 8/1991 | Agrawal et al. | 364/900 |
| 5,073,731 | 12/1991 | Oh | 307/482 |
| 5,099,150 | 3/1992 | Steele | 307/465 |
| 5,208,773 | 5/1993 | Okitaka et al. | 365/189.04 |
| 5,253,205 | 10/1993 | Eaton, Jr. | 365/203 |

OTHER PUBLICATIONS

Foss et al., "Peripheral Circuits for One-Transistor Cell MOS RAM's", *IEEE Journal of Solid-State Circuits*, vol. SC-10, No. 5, Oct. 1975.

Foss et al., *Design Analysis and Comparison of Silicon Gate 4K RAMS*, Feb. 1976, Section 5.

Engineering Course in MOS Technology, American Microsystems, Inc., 1969, p. 8-7.

Primary Examiner—Edward P. Westin
Assistant Examiner—Richard Roseen
Attorney, Agent, or Firm—Townsend and Townsend Khourie and Crew

[57] ABSTRACT

A method and device for performing logic functions. A logic array (1) is controlled by a plurality of DRAM cells (101). The DRAM cells are, in preferred embodiments, loaded in a serial fashion with a shift register (1205). Refresh according to one aspect of the invention utilizes a shift register (1201) with a circulating "0." A charge pump circuit, voltage boost circuit, and a variety of memory cell/logic array configurations are also disclosed.

14 Claims, 17 Drawing Sheets

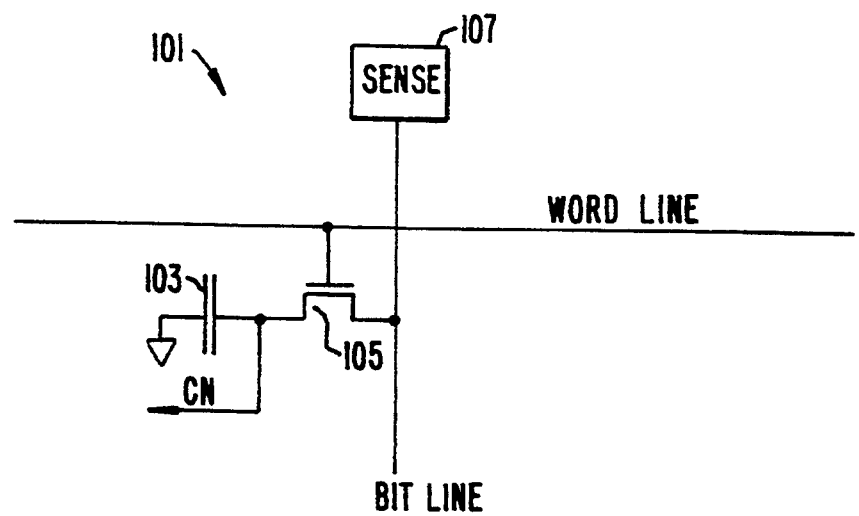
FIG. 3.
FIG. 4A.   DISTURBED ONE
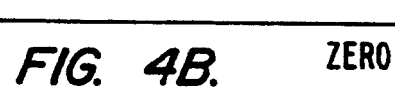
FIG. 4B.   ZERO
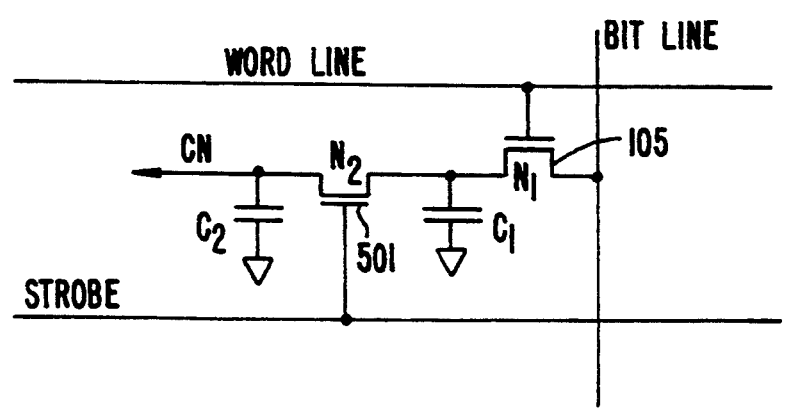
FIG. 5.

DYNAMIC CONTROL OF CONFIGURABLE LOGIC

This is a continuation of U.S. patent application Ser. No. 08/034,451 titled "Dynamic Control of Configurable Logic" and filed on Mar. 19, 1993 which is herein incorporated for all purposes.

The present invention relates to the field of semiconductor devices and methods of operating such devices. More specifically, in one embodiment the invention provides a field programmable logic device with dynamic memory control.

The expense of designing integrated circuits for special applications has served as an incentive to develop several ways of using standard circuits that may be modified by a user to perform particular functions. Gate arrays are an example of an integrated circuit that may be modified to satisfy a special user need using, for example, laser programming. This solution is still too expensive for many limited production runs and in prototype design. To overcome this limitation field programmable gate arrays (FPGA) were developed.

In the earliest field programmable gate arrays, the functions of logic cells and the interconnections between cells were controlled by flip-flops. The flip-flops were loaded with a configuration program entered from the outside of the chip. Once this program was loaded, the standard chip was customized to perform specific functions.

In later designs various means for customizing the array functions have been utilized. Among the methods proposed are the utilization of "anti fuses", which is the reverse of using fuses or "cutpoints." Another common logic circuit today utilizes static ram flip-flops to control the array functions. Typically long shift registers with shift and hold functions are used in such devices to load the control bits into the arrays. Another type of field programmable gate array utilizes EPROM or EEPROM cells to define the logical function to be performed by the device.

While meeting with substantial success, prior devices have also met with certain limitations. For example, such devices typically occupy more semiconductor area than would be desirable and, therefore, are more costly and difficult to manufacture.

From the above it is seen that improved field programmable gate arrays and methods of operating such devices are needed.

SUMMARY OF THE INVENTION

An improved configurable logic device is provided by virtue of the present invention. The charge level of a capacitance is used to control the state of the controlled nodes in a gate array or other logic device. The capacitance's only function is to hold a charge long enough to "remember" if it represents a one or a zero until it is read and refreshed.

The control of gates and switches by the capacitances requires a steady and well defined signal level on the capacitance that is not generally compatible with conventional dynamic ram capacitors. The present invention to overcomes the effect of the dynamic voltage variations in a storage capacitance so that dynamic memory cells reliably control switches and gates in a programmable logic devices. Several alternative methods are presented, all of which mask the voltage transients imposed on the memory capacitors typical of DRAMs. In preferred embodiments, the refresh of the dynamic memory cells and the "read" of the cells by the logic device may occur simultaneously since voltage transients on the stored capacitance are minimized during refresh. Accordingly, in most preferred embodiments, the refresh and read need not be synchronized to avoid the simultaneous occurrence of these events.

Accordingly, in one embodiment the invention provides programmable logic in an integrated circuit. The device includes logic means for outputting signals representative of logical functions of inputs to the integrated circuit; means for inputting data to an array of capacitance means for storage of selected voltage levels thereon, the data representative of a desired logic function; means for refreshing selected voltages in the array of capacitance means, each of said capacitance means comprising a control voltage node; and means for reading out data from the control node while refreshing the selected voltages in the array of capacitance means, whereby logic functions may be performed with the logic means when the capacitance means are being refreshed.

Among other advantages, it is expected that the present invention will result in programmable logic with substantially smaller memory cell size. For example, a typical SRAM cell in presently manufactured devices could occupy about 335 square microns. SRAM area on a typical programmable logic chip would be in the range of 31% of chip area. By contrast, the present invention will result in estimated cell areas of between about 45 and 67 square microns. Therefore, device size would be reduced by about 80% of 31%, or about 25%. Obviously, with significant chip size reduction, attendant changes will result in device capability and/or yield.

A further understanding of the nature and advantages of the inventions herein may be realized by reference to the remaining portions of the specification and the attached drawings.

BRIEF DESCRIPTION OF THE DRAWINGS

FIG. 3 illustrates one embodiment of a memory cell;

FIGS. 4A and 4B illustrate disturbance of a "one" and a "zero" on a memory cell;

FIGS. 5 to 10 illustrate alternative memory cells;

DESCRIPTION OF THE PREFERRED EMBODIMENTS CONTENTS

I. General
II. Memory Cells
III. Sense/Load/Refresh
IV. Alternative Embodiments
  A. Dummy Cell Embodiment
  B. Half Cell Dynamic Memory
  C. Four-Phase/Floating Bit Line Embodiment
V. Peripheral Circuits
  A. Pump Circuit
  B. Bootstrap Circuit
  C. Secondary Pump
VI. Signal/Noise Level Considerations
  A. Noise Level Reduction
VII. Conclusion
  I. General The present invention utilizes dynamic memory cells in the operation of programmable logic such as a programmable gate array. The invention overcomes the effect of the dynamic voltage variations in the memory cells of a dynamic memory device such that the dynamic memory cells can reliably control switches and gates in programmable logic devices, such as FPGAs.

Several alternative methods are presented, with a common goal of masking out the voltage transients imposed on the memory capacitors typical for dynamic memory. An overriding goal is of course to reduce the circuit area and thereby the cost of controlling the functions of the FPGAs.

Figure 1A:
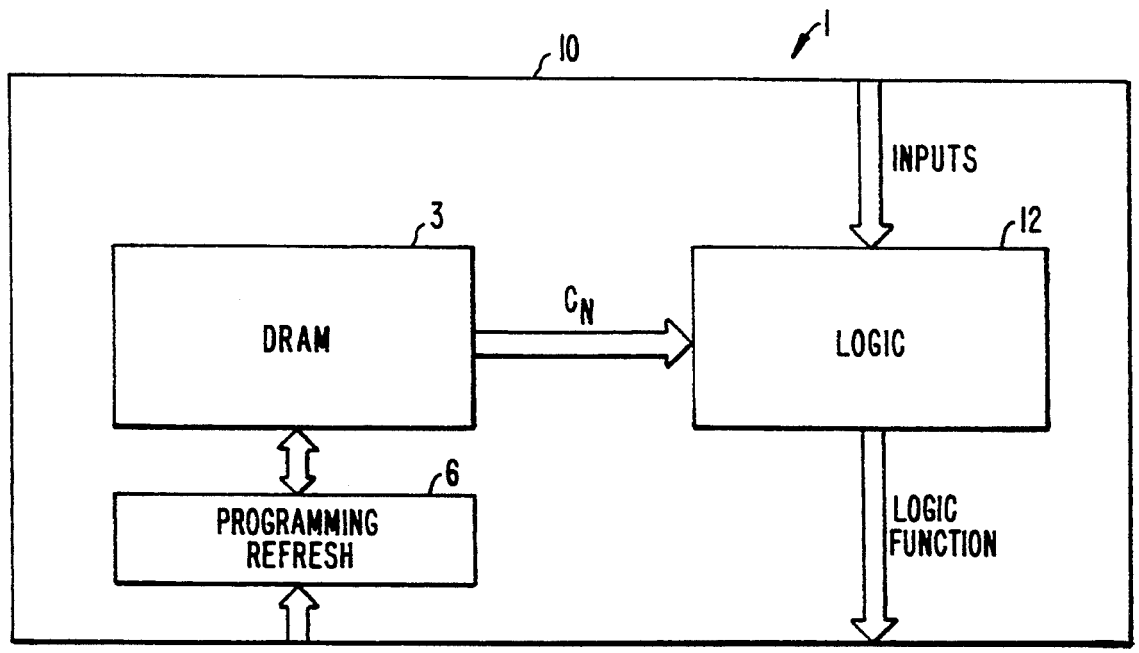
FIGS. 1A and 1B are overall illustrations of a dynamic configurable logic device (DCLD) according to one aspect of the invention.

FIG. 1A is an overall illustration of one embodiment of a dynamic memory configurable logic device 1. As shown, the device provides an array of dynamic memory cells 3 that are periodically refreshed by programming/refresh means 6, all contained on a single integrated circuit structure 10. The integrated circuit structure further includes logic device(s) 12 that are controlled by various control nodes CN in the dynamic memory. The logic device 12 provides outputs that are logical functions of inputs wherein the logical functions are based on the state of control nodes CN in the dynamic memory. Of course, in most devices the memory and the logic will be physically intermixed such that the memory will be in close proximity to the controlled device.

Figure 1B:
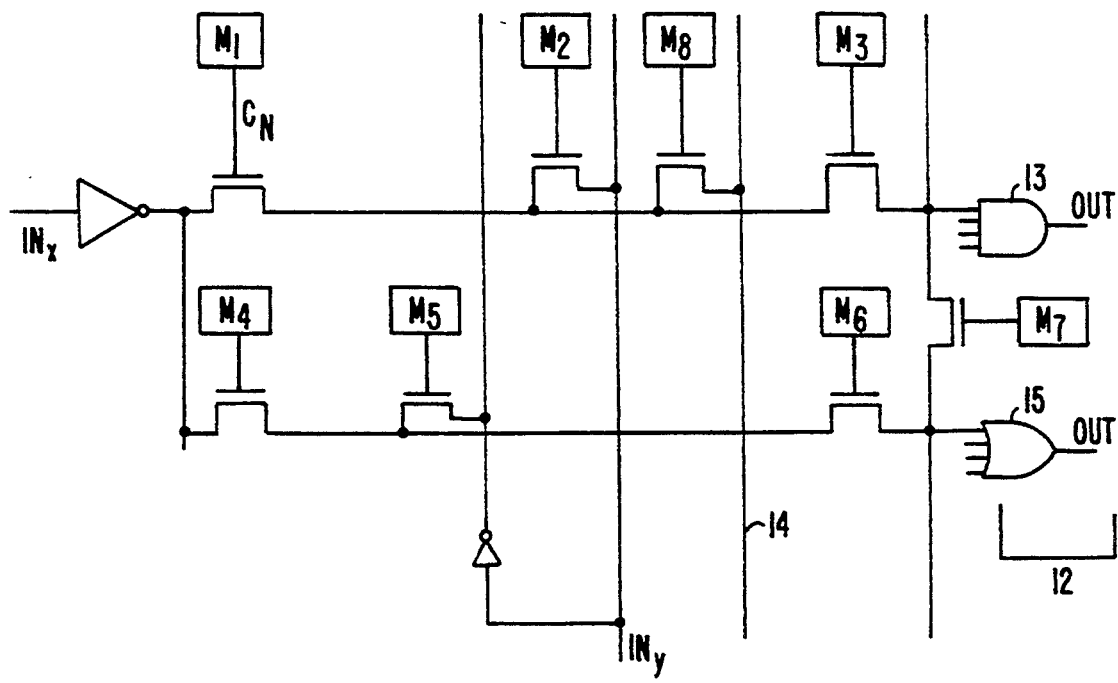

FIG. 1B provides a simplified version of a device such as the one shown in FIG. 1A in which logic inputs are selectively passed through switches controlled by dynamic memory cells. As shown therein, various inputs such as inputs $IN_x$ and, optionally, orthogonal inputs $IN_y$ are provided to the device. It will be recognized that many such inputs will normally be provided, although only two are illustrated for simplicity. Often, both the true and complement of inputs will be generated and provided to the logic device as indicated in the Figure.

As dynamic memory cells M are used to direct selected inputs to one or both of AND gate(s) 13 and/or OR gate(s) 15. For example, if it is desired to provide the AND gate 13 with $IN_x$ as a product term, $M_1$ and $M_3$ are programmed high. If it is desired to provide $IN_x$ as an input to OR gate 15, $M_7$ is also programmed high. Similarly, $M_2$ can be used to steer $IN_y$, to the inputs of gates 13 and 15, etc. $M_8$ may be used to transfer data to/from a horizontal line $IN_x$ from/to a vertical bus line 14 that intersects many input lines. $M_3$ and $M_6$ are used for isolation of the gates when a signal is to be transferred to the vertical bus, but not to the input of a gate. The device illustrated in FIG. 1B can be viewed as utilizing dynamic memory cells to address various inputs for use in AND or other logic gates and for connecting segments of data buses, horizontal and vertical.

Figure 2A:
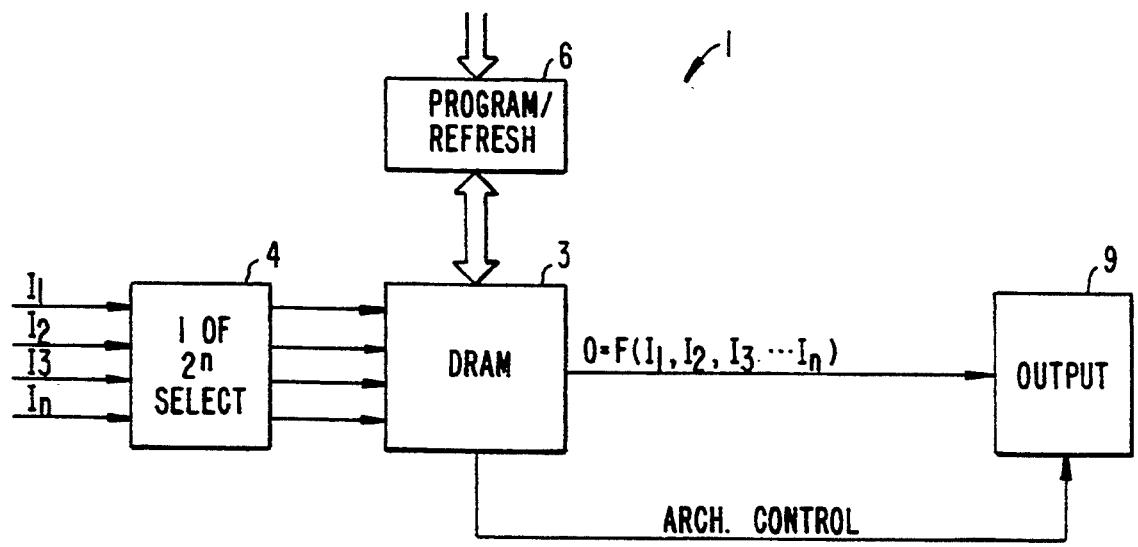
FIGS. 2A and 2B illustrate a look-up table device for use in association with a programmable logic device operating under the control of dynamic memory cells.

Conversely, as illustrated in FIG. 2A, the inputs can be used to address selected memory cells, the stored value outputs of which are utilized in a logic function. Like the device illustrated above, this device also includes one or more arrays of dynamic memory cells 3. The memory cells are programmed and periodically refreshed with program/refresh circuit 6. Various inputs I are provided to a cell selection circuit 4, which selects a value stored in one or more of the memory cells for output. For example, if all of the inputs are asserted, this may indicate that the value of the $2^n$th cell is to be output. If this cell has a high value, the output will be high. If this cell has a low value stored therein, the output will be low.

The outputs are normally combinatorial functions of the various input values. A simple example is provided below. Assume particular user desires is:

| Input $I_1$ | Input $I_2$ | Output |
|---|---|---|
| 0 | 0 | 0 |
| 0 | 1 | 1 |
| 1 | 0 | 0 |
| 1 | 1 | 1 |

The combinatorial function described by this table is $O = A \cdot B + \overline{A} \cdot B$. Accordingly, four memory bits would be provided in the DRAM 3 in this simple example. Those with "addresses" 11 (corresponding to A high and B high) and 01 (corresponding to A low and B high) would be set high. Others would be low. When either of these addresses is applied to the inputs, the output will be high; otherwise the output will be low. Accordingly, it is seen that dynamic memory may be used to implement combinatorial logic functions.

Additional functionality will normally be provided by the device. For example, output circuit 9 may be used to select between registered and non-registered output. Memory 3 may, therefore, have additional bits that serve as architecture control bits. For example, one architecture control bit may be used to select between registered and non-registered output in the output block 9.

Since the outputs are generated by providing the various inputs as an address to a particular memory bit in the array, the number of memory bits needed will depend at least partially on the number of inputs that are to be provided. Normally $2^n$ or more memory bits will be provided, where n is the number of inputs to the array. Of course, the invention may readily be further modified to provide multiple outputs, provide feedback, and the like, in which case much larger numbers of bits may be utilized.

Figure 2B:
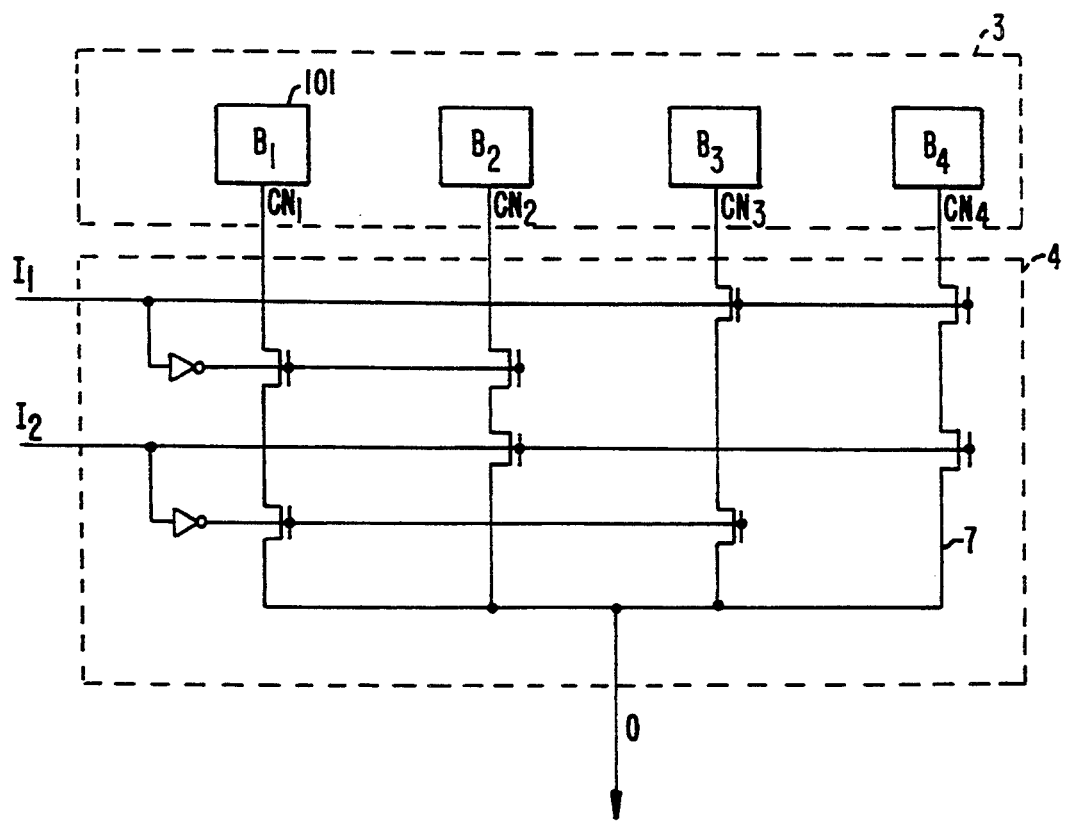

FIG. 2B provides a schematic illustration of hardware that would be used in association with the device shown in FIG. 2A in greater detail. A simple two input logical device is again used for illustration. As shown therein, four memory bits 101 are used in the DRAM 3. The inputs I are connected to define each of the possible combinatorial functions of the two inputs. For example, the output of the line 7 defines the function $I_1 \cdot I_2 \cdot B_4$. Accordingly, bit $B_4$ is programmed to provide a high output to its control node CN in the case where $I_1 \cdot I_2$ is desired as one of the product terms of the combinatorial function. The output O will be the logical OR of all of the product terms designated by the various memory bits B. For the particular truth table shown above, the control bits $B_3$ and $B_4$ would be set high and the remaining bits would be set low to generate the logical function $\bar{I}_1 \cdot I_2 + I \cdot I_2$. Of course, additional elements may be provided, such as buffers on the memory cell control nodes CN or on the output nodes that are not shown for simplicity.

II. Memory Cells

FIG. 3 shows one typical dynamic memory cell 101 used in accordance with one aspect of the invention. A high or a low voltage is stored in a capacitance 103 depending on whether a ONE or a ZERO, respectively, is located on the memory cell. The memory cell voltage is "read" in the present invention via the control node CN that is located between a memory cell transistor 105 and the capacitance 103. The voltage stored on the memory cell capacitance will determine the logic function to be performed by a logic device. The capacitance 103 may take the form of, for example, a conventional capacitor or parasitic capacitance.

Due to the leakage of charge from the capacitance its charge must be refreshed periodically. Refreshing is accomplished by addressing the memory cell via a word line, "reading" the charge level stored thereon, and applying the correct refresh voltage to the bit line. For example, in the embodiment shown in FIG. 3 the word line is brought high, rendering transistor 105 conductive and coupling the capacitor to the bit line. The appropriate high voltage is developed on the bit line via a sense amplifier 107 for restoration of the full charge on the capacitor when a 1 is stored, or the bit line is brought to ground when a 0 is stored.

At the moment of reading before refreshing a small amount of charge is drawn from the capacitor. This charge is replaced quickly, but the voltage on the capacitor is momentarily disturbed as indicated in FIG. 4A, wherein the voltage level at the storage node is shown to be disturbed downwards when a "1" is stored on the capacitor. Conversely, as indicated in FIG. 4B, the voltage at the control node of a capacitor with a "0" stored thereon is normally disturbed upwards since the bit lines are typically precharged to an intermediate voltage between the 0 and 1 levels. The cell as shown in FIG. 3 can be used directly if the circuit logic is synchronized with the refresh cycle so that the logic system reads the capacitor voltage during times when the capacitor voltage is not disturbed for refresh. In practice this limits operating speed, increases circuit complexity, and otherwise negatively impacts the device. Therefore, it is desirable to utilize other methods of refreshing the circuit while still maintaining the ability to utilize the capacitor voltage in a logic circuit, even when the cell voltage is impacted during a refresh operation.

According to a preferred aspect of the invention, the noise amplitude is reduced to acceptable levels such that the logic circuit will reliably read the capacitor voltage during either the disturbed or undisturbed portion of the cycles shown in FIG. 4. In general the invention will utilize large capacitors and shorter bitlines, but will still result in smaller overall chip areas than other logic devices.

FIG. 5 shows another memory cell that may be utilized in accordance with one aspect of the invention. In this embodiment, an extra transistor 501 is introduced with its gate connected to a "strobe" signal. The transistor 501 separates a memory capacitor $C_2$ from a refresh capacitor $C_1$ except when the strobe signal is activated. Therefore, the circuit separates capacitor $C_2$ from the memory capacitor $C_1$ during the time of the refresh disturbance. $C_2$ may be a very small capacitor (such as about 10–20 fF using current device technology), and in some embodiments may only be the load capacitance of the controlled logic gate, while $C_1$ is large enough (e.g., 30–50 fF using current device technology) to provide a reliable reading in connection with the refresh cycle. During refresh, transistor 501 is off, and isolates the memory capacitor from the refresh disturbance. Therefore, also during refresh the voltage on capacitor $C_2$ may be used in the device logic as a control signal. The strobe signal goes active after the capacitor $C_1$ has been refreshed, such that the capacitor $C_2$ is also refreshed. When the strobe is active, the voltage on $C_2$ is supported by the charge from $C_1$. The strobe can be a global signal or it can be active only for a row that has just been refreshed.

In either case the programming logic will preferably enable the strobe function so that both $C_2$ and $C_1$ would be fully charged when the original control pattern or data are written into the array. The advantage of this arrangement is that even if $C_2$ is unusually large, which could occur for long connecting lines, $C_2$ would be fully charged. Individual strobe lines for each row will reduce the dynamic power consumption.

Figure 6:
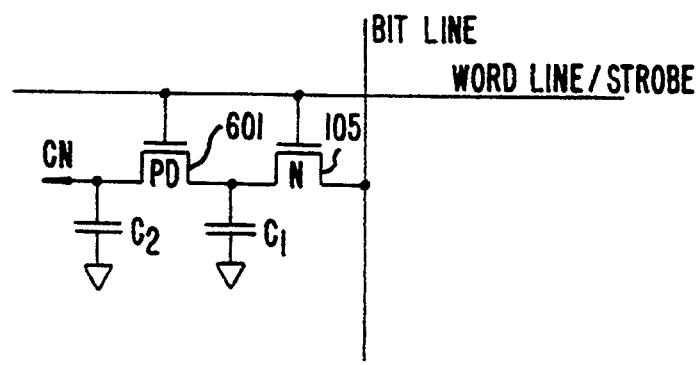

FIG. 6 illustrates another memory cell that may be used in accordance with the invention. In this case, the word line is used as a strobe by replacing the N-channel transistor 501 with a P-channel depletion mode transistor 601. Accordingly, during refresh, the word line is high, providing charge to the capacitor $C_1$. After refresh, the word line is brought low, permitting charge to flow from $C_1$ to $C_2$. Again, the voltage at $C_1$ may be used at any time (during refresh or not) in the device logic.

Figure 7:
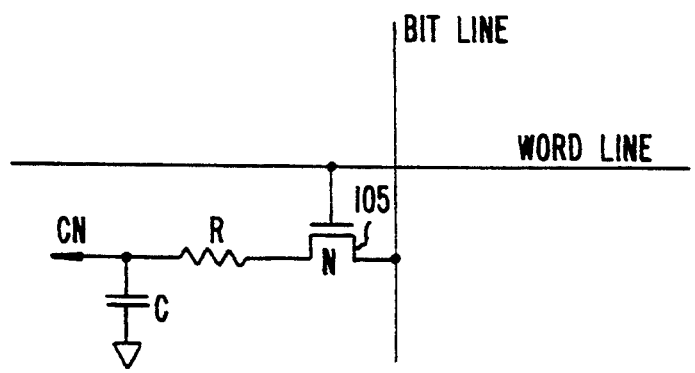
Figure 8:
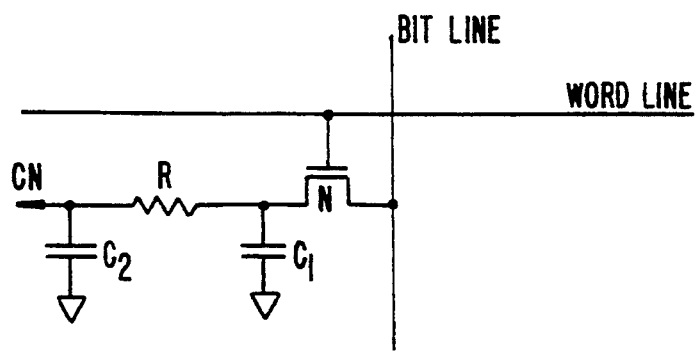
Figure 9:
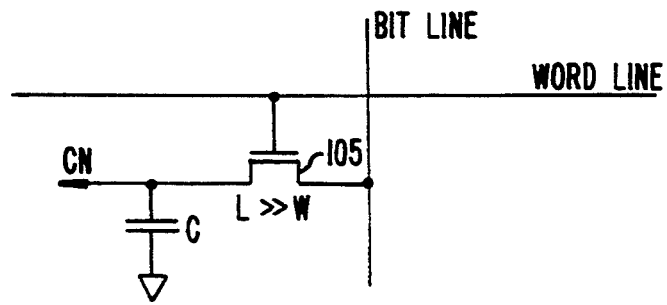

The refresh disturbance on the memory capacitor can also be filtered out using the traditional RC filter as indicated in FIGS. 7, 8, and 9. In the embodiment in FIG. 7, a resistor R is formed between the memory cell capacitor C and the cell transistor 105. The relation between R and C will be set such that R is small enough to give sufficient signal to the sense amplifier, but large enough to filter out the voltage swing on the bit line during the read refresh cycle such that the swing does not exceed a desired level. For example, using conventional, present technology R will be about 100 kΩ. The associated amplifier's speed of response will be increased when the bitline capacitance is low and the transistors in the amplifier are large. This is accomplished if the number of bits per bit line is minimized. The memory cell capacitor and the resistor must still be relatively large.

In the embodiment shown in FIG. 8, a resistor R is provided between memory capacitor $C_2$ and refresh capacitor $C_1$. The arrangement according to FIG. 8, with $C_1$ and $C_2$ of approximately the same size, has the advantage that the instant signal to the amplifier is much large when the wordline is accessed. Therefore the amplifier response time is shorter, shortening the duration of the disturbance on $C_1$. The filtering R-$C_2$ time constant can therefore be shorter. The size of resistor R depends to a high degree on the available processes, but with present device technology will be about 100 kΩ.

The resistor can of course be replaced with a long and narrow switching transistor 105 as indicated in FIG. 9.

Figure 10:
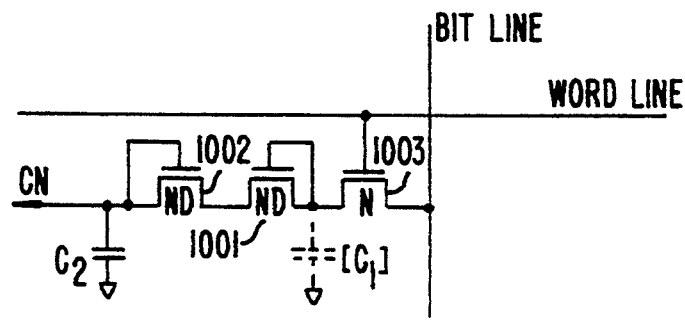

FIG. 10 illustrates another memory cell according to one aspect of the invention. In this embodiment, depletion mode, N-channel transistors 1001 and 1002 are utilized. In essence, the devices 1001 and 1002 make up a resistor/capacitor circuit similar to that shown in FIG. 8. The transistor 1001 has its gate tied to the source/drain of transistor 1003. The resistor can be made up of two such devices connected as indicated in FIG. 8.

III. Sense/Load/Refresh

Figure 11:
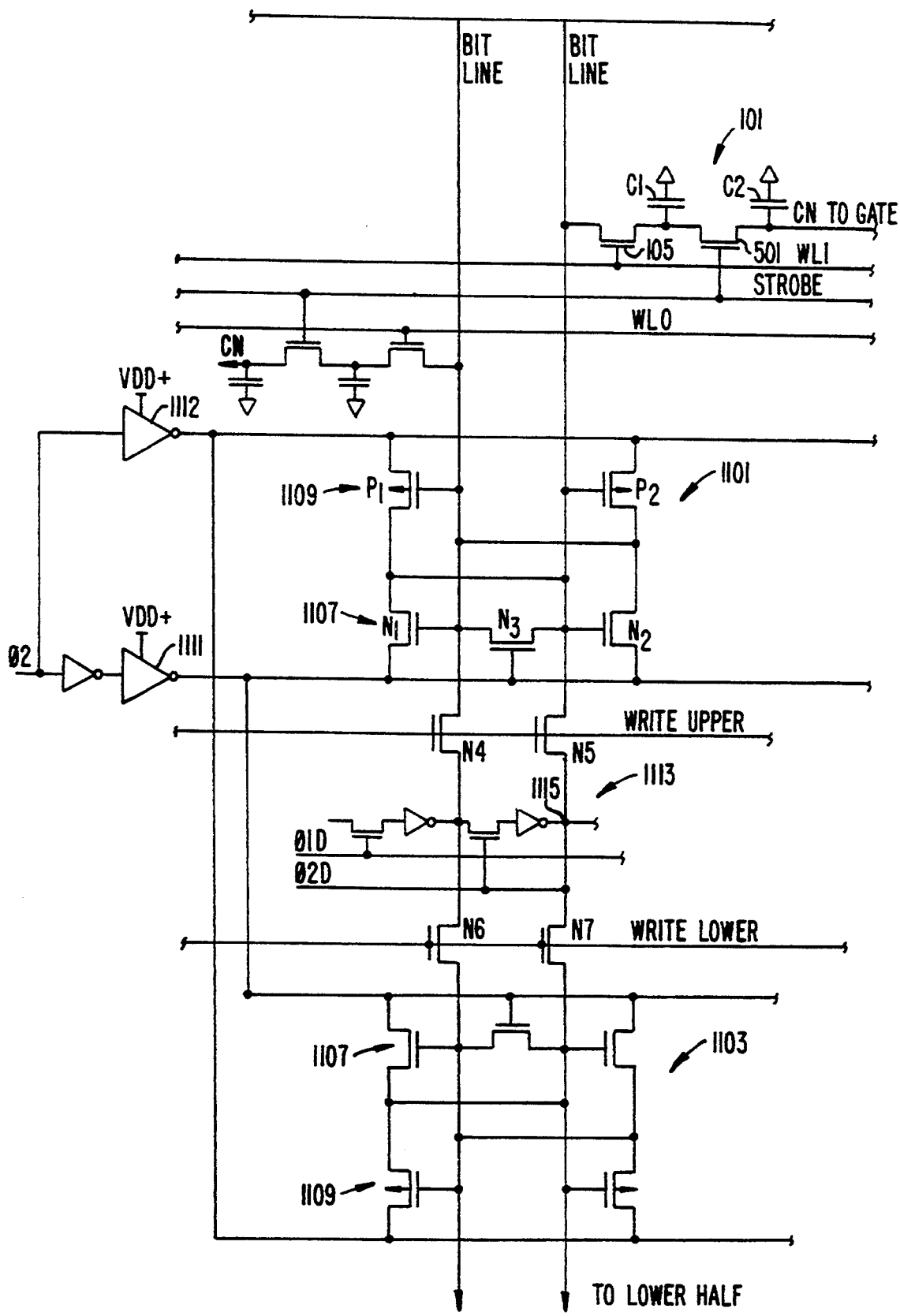
FIG. 11 illustrates aspects of the sense and load portions of the memory in the DCLD.

A sense, load, and refresh circuit is illustrated in FIG. 11. This particular embodiment is adapted for the memory cell arrangement shown in FIG. 5. As shown there are two rows of sense amplifiers 1101 and 1103, one row for the upper half of the array and one row for the lower half of the array respectively. The device utilizes "folded bit lines" in which one bitline reads and restores cells addressed by even numbered word lines and the other bitline reads and restores cells addressed by odd numbered word lines. The bit lines extend int he same direction from the sense amplifier, which provides alpha particle error protection and other benefits. Each amplifier is a DMOS sense amplifier of the type well known to those of skill in the art of dynamic memory design and contains two cross-coupled pairs of transistors including a cross-coupled pair of NMOS transistors 1107 and a cross-coupled pair of PMOS transistors 1109.

Each row of amplifiers is powered by two buffer drivers 1111 and 1112 with complement outputs. When the amplifier are active, the sources of the N-channel transistors N1 and N2 are connected to ground and the sources of the P-channel transistors P1 and P2 are connected to a positive supply voltage. As will be discussed later, this positive supply voltage is preferably higher than the $V_{dd}$ normally used in the chip. Accordingly, when the amplifiers are active (i.e., when 1112 produces a high potential and 1111 produces a low potential), the higher of the two bit lines is brought to $V_{dd}$ or above, while the lower of the two bit lines is brought to ground.

When the polarity of the buffer drivers is reversed, the bit lines will be precharged to an intermediate voltage between 0 and $V_{cc}$ near the switching points of the cross-coupled pairs, typically a potential close to half of the supply voltage. Transistor N3 is also turned on during a precharge mode, bringing the bitline pair to the same potential.

During a refresh of a memory cell, its word line is brought high and the sense amplifier is activated. At essentially the same time the selected word line is brought high, the strobe signal is brought low. The selected memory capacitor, if at low potential will pull its bitline low enough to cause the flip-flop to switch to the low potential on the selected bit line. On the other hand if the selected memory capacitor is at high potential the selected bitline will swing to the positive potential, thus refreshing the high charge on the memory capacitor.

Programming data are fed into the chip via a shift register 1113. When the register has been filled, the shifting stops and the register holds its data until the refresh starts. At the same time as the amplifiers 1111 and 1112 are activated, a "Write Upper" or a "Write Lower" signal is applied. This will connect the appropriate nodes on the shift register to the sense amplifier and force the sense amplifier to store a 1 or 0 state in the memory capacitors along the activated word line. For example, if the data shifted into the shift register produce a low voltage at node 1115 and WRITE UPPER is activated while WL1 is active, a low voltage level will be stored in memory cell 101. In alternative embodiments, reading of data by the logic array from the capacitors during the loading of data will be disabled.

The polarity requirement is different for the bit lines associated with the even and the odd word lines since, in preferred embodiments, a single bit will comprise change of opposite polarity stored on both of the adjacent bit lines. Data are therefore complemented before feeding the shift register for either the even or odd word lines. The lower half of the array is a mirror image of the upper half.

Figure 12:
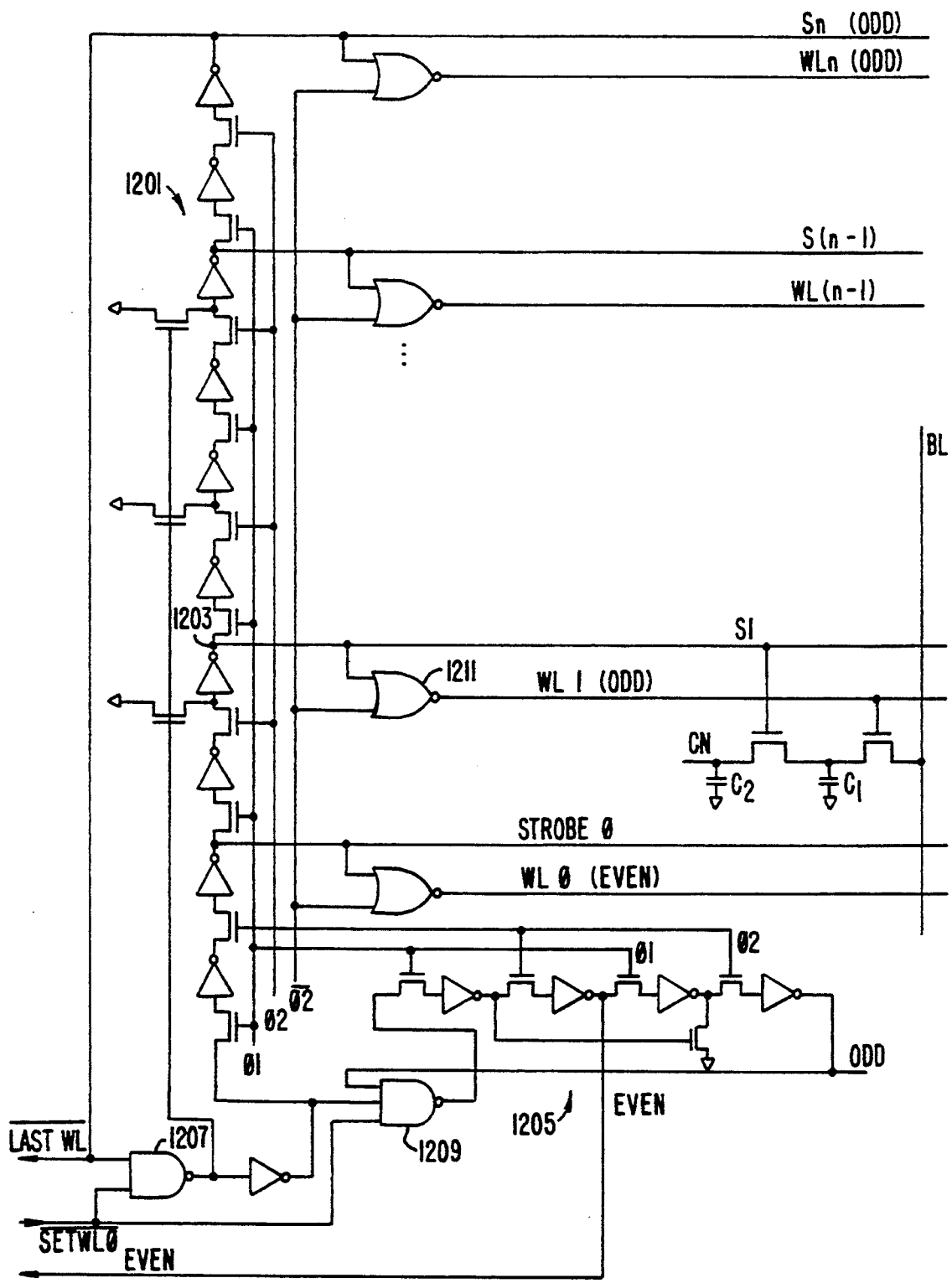
FIGS. 12 and 12A illustrate the programming portion of the device in greater detail.

FIG. 12 illustrates a dynamic shift register 1201 used for sequential addressing of the word lines as part of a refresh and data load function. In this particular embodiment, each word line $WL_i$ has its own strobe line $S_i$. The shift register 1201 is set up so that it can only circulate one ZERO bit, with all other bits=ONE (i.e., high). The position where the zero, represented with a low level, occurs will bring the associated strobes low. For example, when the low signal is at node 1203, other strobes such as $S_n$ will be high. During this time, the memory capacitors $C_1$ will be refreshed. When the strobe line later goes high, the zero shifts to the next position, and the memory cell $C_1$ will be connected to $C_2$ by the high strobe line. The word line associated with the low strobe line will initially be low. Then, when $\phi_2$ is high, the word line (e.g., WL0, WL1, etc.) associated with the low strobe (e.g., STROBE 0, S1, etc.) goes high via NOR 1211, permitting refresh of the associated capacitors $C_1$. The high word line then returns to normal, and $\phi_1$ is activated, clocking the low signal to the next shift register location. Accordingly, memory capacitors $C_2$ are refreshed along single word lines in a serial fashion beginning with word line 0, tracking the circulating zero.

Figure 12A:
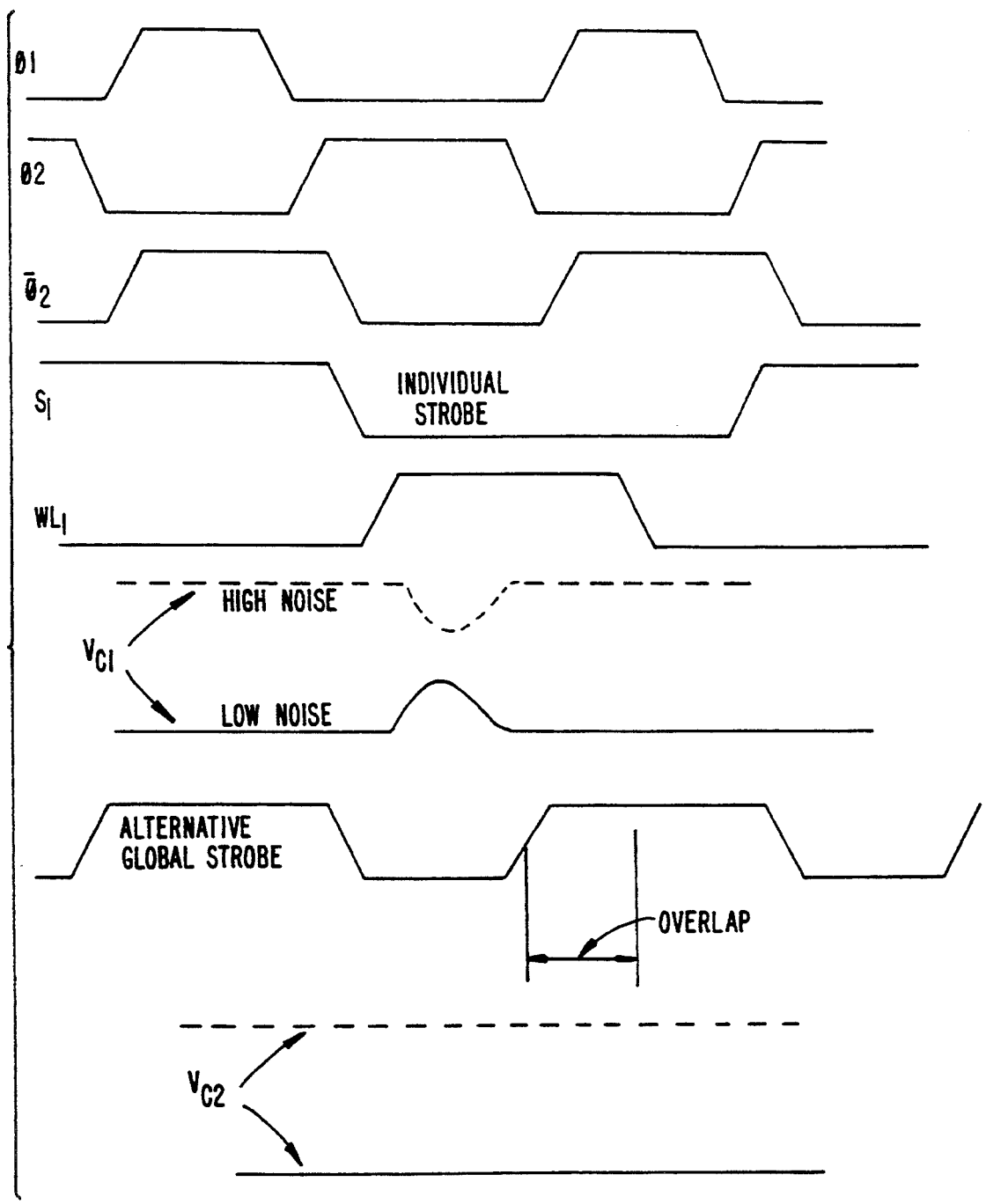

FIG. 12A illustrates the timing of the $\phi_1$, $\phi_2$, WL1, $VC_1$, $VC_2$ and S1 signals discussed above during the refresh of the $C_1$ and $C_2$ capacitors along the WL1 word line as the low signal passes through node 1203. When $\phi_2$ goes high, the low voltage signal is generated at node 1203, bringing S1 low and beginning refresh. Later, $\phi_1$ goes high taking the low bit to the next stage. $\phi_2$ then again goes high, bringing node 1203 high again, along with S1. Refresh occurs when WL1 is high. When the low signal reaches the last strobe line $S_n$, this generates the signal LAST WL bar simultaneously. As shown, the voltage on $C_1$ is momentarily disturbed when the word line is high. However, the voltage on $C_2$ is largely undisturbed.

FIG. 12A also shows the preferred timing for a global strobe signal, which replaces the individual strobes $S_\phi$ . . . $S_n$. The strobe returns positive while the word line is still high, securing full refresh on both $C_1$ and $C_2$. The same timing on individual strobes can be arranged at a slightly higher cost.

FIG. 12 also shows a two stage shift register 1205 that is used to keep track of odd and even addresses. The shift register is clocked with $\phi_1$ and $\phi_2$. If, for example, EVEN begins high, and after $\phi_1$ and $\phi_2$ have been high, the register will clock the signal ODD high. This will repeat until LAST WL bar has gone high, resetting the register to its initialized state via NANDs 1207 and 1209. Alternative circuitry such as a toggle flip-flop may also be used for this purpose. It is assumed that the address shift register is duplicated for both halves of the array, for the case when the arrangement in FIG. 11 is used. An even number of word lines is illustrated, so that when the last word line (WLn), which is odd, shifts the circulating low to the first word line (WL0), the odd-even register shifts to generate the signal EVEN. Both shift registers have provisions to block forbidden bit combinations by setting a "1" to all but the first position at the last word line time. The registers can also be set to WL0 and EVEN when a load request is sent to the chip.

Figure 13:
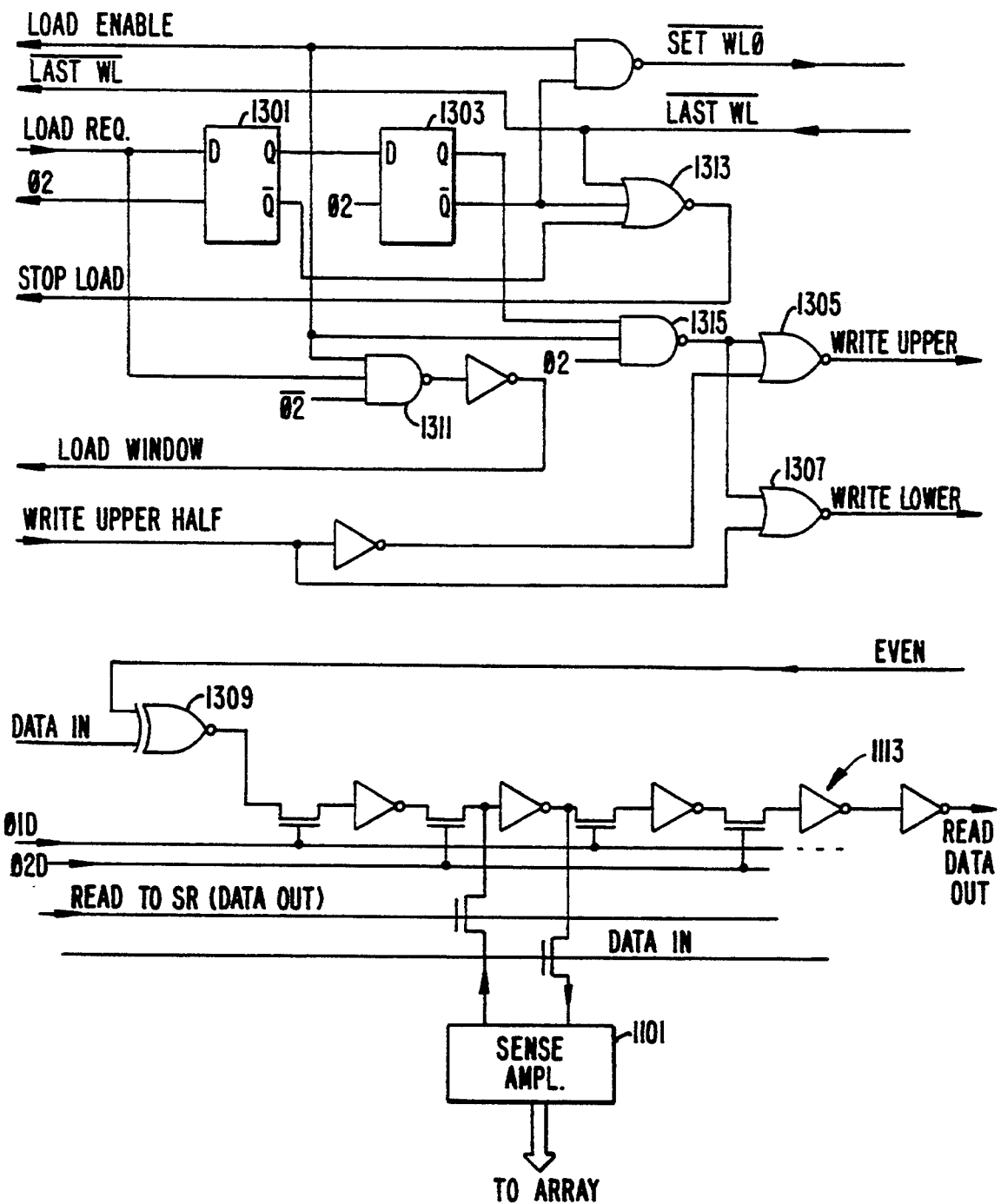
FIG. 13 illustrates details of a data loading circuit according to one aspect of the invention.

FIG. 13 shows an example of the type of control that can be used to communicate with outside for loading of data onto the chip. A load request signal LOAD REQ is applied by the user and is synchronized to the refresh clock which is internally generated on the chip. A signal LOAD ENABLE is returned to the programmer and will stay on one clock cycle beyond when LOAD REQ stays active. LOAD REQ is clocked into flip-flop 1301 with clock $\phi_2$ and, thereafter, to register 1303 with the next $\phi_2$ clock. The user also provides a signal to indicate whether data are to be written to the upper half of the chop, WRITE UPPER HALF. Using NAND 1315, when WRITE UPPER HALF and LOAD REQ are high, the WRITE UPPER signal will be high during $\phi_2$, allowing data to be written into the upper half of the array. Alternatively, when WRITE UPPER is low, data may be written to the lower half of the array since WRITE LOWER will be high using NOR gates 1305 and 1307, respectively.

This circuit also generates SET WL0 bar. When LAST WL bar is received, the WRITE UPPER and WRITE LOWER signals will be deactivated by the controlling system bumping load request low.

The data shift register is advanced by clock signals from the programmer, $\phi_{1D}$ and $\phi_{2D}$. This clock will be run in bursts, each burst transferring as many bits as the register holds (as many as the number of amplifiers in each row). As shown, the data are provided at DATA IN, and are inverted with XOR gate 1309 with a signal EVEN, which indicates that an uneven row being addressed. For test purposes it is desirable to read stored data. READ TO SR is used to check the stored data values. READ DATA OUT may optionally be used to check the data after passing through the registers.

There is a window in the refresh cycle during which data can be loaded. This is defined by the LOAD WINDOW signal, that is produced by NAND 1311 and inverter 1315 based on $\phi_2$ bar. As long as LOAD REQ and the accepted LOAD REQ output from flip-flop 1301 are active, the LOAD WINDOW is open once each refresh cycle (during $\phi_2$ bar). Naturally, the clock frequency for loading data must be high enough to complete the loading before the window is closed.

When the last word line has been written a STOP LOAD signal is sent to the programmer via NOR gate 1313 based on LAST WL bar and the data outputs of the flip-flops 1301/1303. If at this time both the upper and the lower halves have been programmed the programmer brings the LOAD REQUEST signal down.

It may be desirable to verify that the correct data has been stored in the control memory. Read and modify operations may also be used to modify only selected cells. To accommodate this, provisions are added to the on-chip control logic and to the DATA IN shift register. For the external programming system where the chip is used to "know" the row address, the last WL signal and one of the refresh clocks are connected to I/O pins. This is illustrated in FIG. 13. The system keeps a separate row count, thus permitting the system to read or write data from or to any row synchronously with the refresh cycle.

Figure 14:
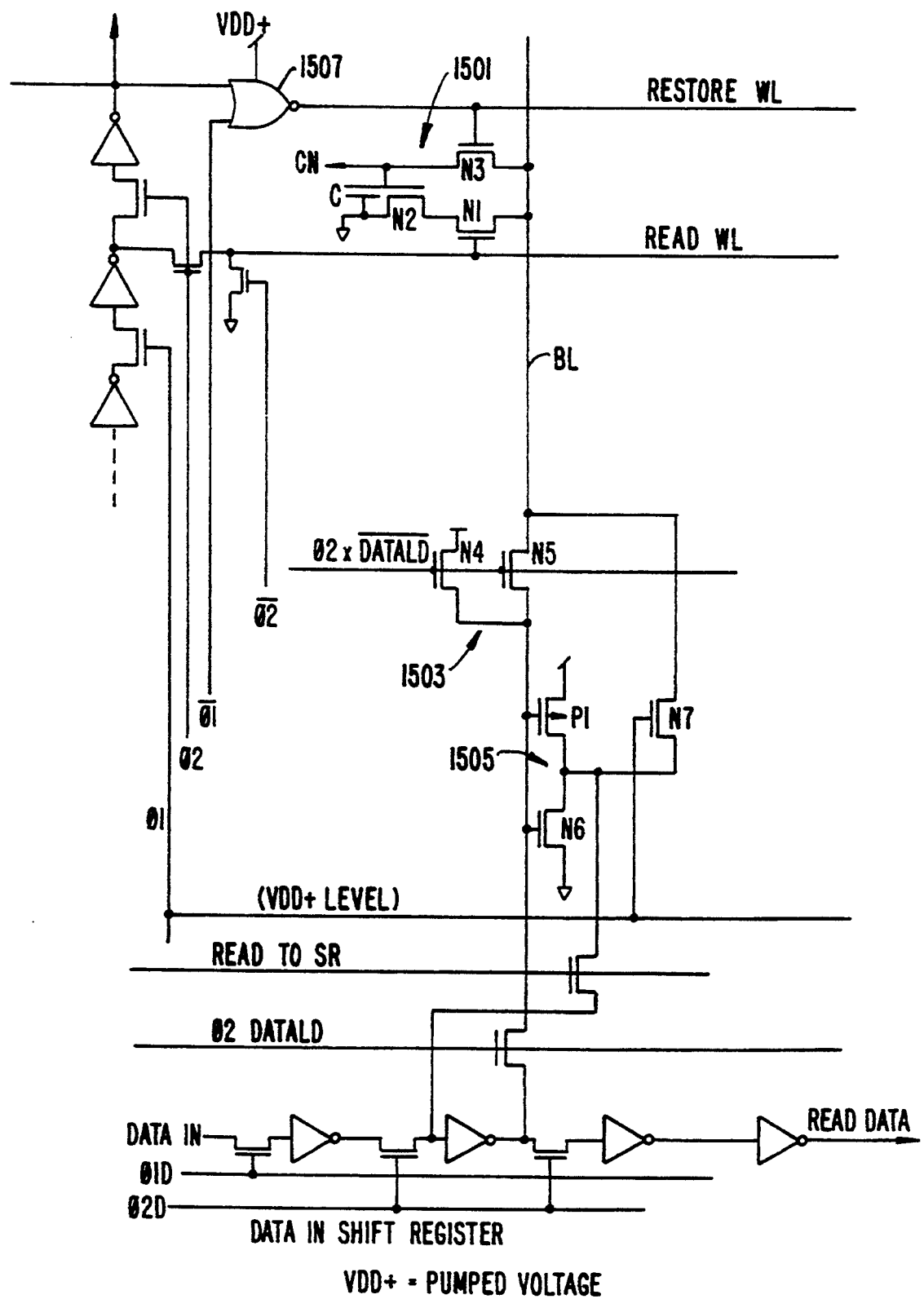
FIG. 14 illustrates a half cell design.

To read data out, the procedure is as follows. The DATA IN shift register is shifting slowly during normal refresh cycles under control of the refresh clocks (this prevents floating gate situations to cause excessive current drain). At the end of the $\phi_2$ time associated with the row to be read, a READ TO SR pulse is applied to an input pin. As exemplified in FIG. 14, this copies the data read by the sense amplifier to the shift register. After the end of $\phi_2$ and after the READ TO SR pulse, the internal 1 and 2 clocks are replaced with the fast shift clocks $\phi_{1d}$ and $\phi_{2d}$, causing the read data to be shifted out.

A read-modify-write operation can be arranged as follows. The $\phi_1$ and $\phi_2$ clocks can be timed far enough apart so that two complete shifts of data can take place without interfering with either clock. Data are shifted out to the system bit by bit and returned to the input of the data register on the chip. As the bits pass through the system, old data bits can be replaced with modified ones, if desired. After one complete cycle a data load pulse, replacing the $\phi_2$ 2.DATALD pulse indicated in FIG. 14, transfers the new data to the sense amplifier. The new data is now on the sense amplifiers output before the arrival of the 1 clock used to restore charge to the memory capacitor. Alternatively the full content of the shift register can be shifted out, modified and shifted in during one refresh cycle. Only if more time consuming data modifications are made, will it be necessary to wait for the row to return after a full sequence of refresh cycles.

IV. Alternative Embodiments

A. Dummy Cell Embodiment

Figure 15:
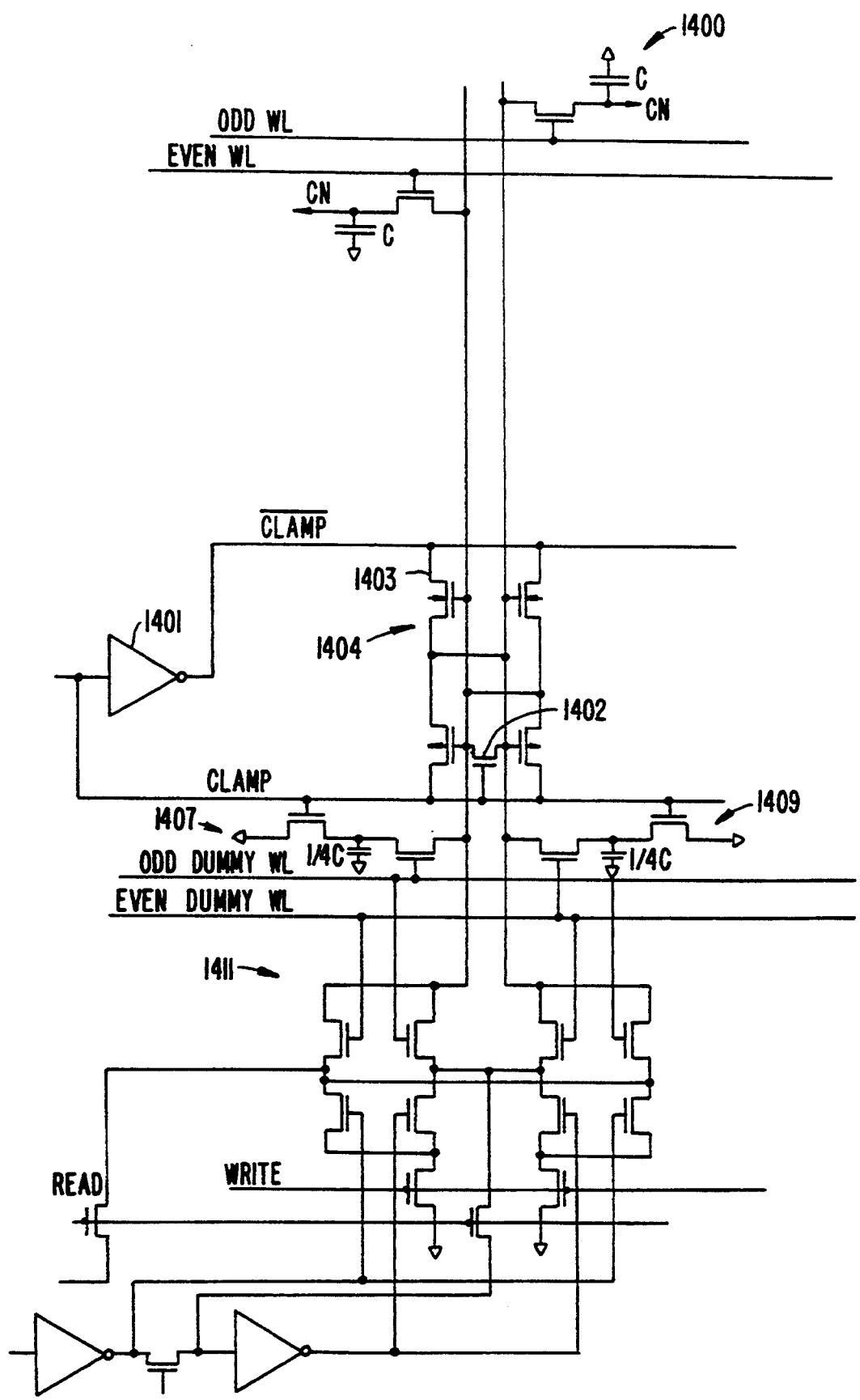
FIG. 15 illustrates the invention when dummy memory cells are utilized.

FIG. 15 illustrates an arrangement using the basic DRAM cell combined with "dummy cells." A wordline will in a typical array be very long and with high capacitive load. The line, preferably driven from a pumped voltage source, will have a slow rise time. The time connecting a capacitor at low voltage level to its bit line is much earlier than the time at which a capacitor at high voltage is connected to its bit line.

This time difference can be critical for the following reason. The clamping of the bitline pairs brings both to the same potential. Just before the word lines are brought high, the clamping is reversed. The flip-flop goes ideally to a meta stable state with both nodes at the same potential, at the flip-flops switching potential. The switching potential is where the P-channel and the N-channel transistors draw the same current. Due to imprecise design and processing the ratio between device sizes in one leg of the flip-flop may be different than that of the opposite leg. After clamping, this unbalance may be equivalent to a signal already applied to a flip-flop node.

Left alone the flip-flop nodes will proceed to switch in the direction of the unbalance. To minimize the effect of the unbalance the signal from the capacitor should be applied as early as possible after switching the amplifier from the clamping state, making it desirable to read both high and low voltage on applied storage capacitors at the same time. The fact is that if there is not signal from a low capacitor, then the associated capacitor must be at a high level. Adding a dummy capacitor on the not addressed bit line minimizes the delay between the two readings. The disadvantage of a dummy memory cell is that the effective signal from the storage capacitor is "reduced" by the signal from the dummy capacitor. The charge transferred from the dummy capacitor should be half of the charge transferred from the storage capacitor.

As shown in FIG. 15, single capacitor memory cells are provided with single access transistors in each memory cell 1400. As shown in FIG. 15, the voltages on the bitlines are normally clamped to an intermediate voltage, such as $V_{dd}/2$, with a signal CLAMP. CLAMPbar is generated with a large buffering inverter 1401. Accordingly, both of the bit lines are connected together via transistor 1402 and the sources of pull-up transistors 1403 in sense amplifier 1404 are brought low when clamp is high.

When a word line is addressed for refresh, the ODD DUMMY WL signal will be generated when the word line is odd, or the EVEN DUMMY WL signal will be generated when the word line is even, activating the access transistor in the corresponding dummy memory cell 1407 or 1409, respectively. These dummy capacitors will have low or ground voltage stored thereon. When the word line is addressed, the sources of PMOS transistors 1403 will be brought high and the bit lines will be disconnected. The word line (WL) and dummy word line (DWL) voltages will be brought high. Preferably the word line is raised above $V_{cc}$. In the case where the addressed storage capacitor has a low voltage thereon, the addressed storage capacitor voltage (C) will increase slightly, while drawing charge from the bit line. However, the charge drawn from the opposite bit line by the dummy memory cell will be less. Accordingly, the dummy bit line will be higher than the bit line with the addressed cell. The switching will then proceed to completion.

As pointed out earlier the noise on a low capacitor can be held low with the right combination of capacitor size, number of bits on each bit line and the size of the transistors in the amplifier flip-flop. There will be no noise on the high capacitor when the dummy capacitor is used.

In addition to the amplifier flip-flop and the dummy cells FIG. 15 also shows the circuitry 1411 for writing in new data and to read previous stored data. Such circuitry is needed only if the user does not complement the input data.

B. Half Cell Dynamic Memory

In the embodiment below, a very small storage capacitor can be used since the cell has its own amplifier. The bitline capacitance can be large, as there are not speed requirements for this application. Accordingly, a half cell system may be used.

Returning to FIG. 14, the memory cell 1501 includes transistors N1, N2, N3 and capacitor C, which is preferably the extended gate of transistor N2. Two word lines are used for each row of cells, one for reading (READ WL) and one for restoring (RESTORE WL) the charge on capacitors C. The amplifier is basically an inverter, so that the read signal on the bit line can be reinverted and returned to the bit line at the restore time.

The operation of the read restore and data write operations are as follows. The address shift register works the same as described in the above embodiments. The first inverter in the selected shift register stage is set by the $\phi_1$ clock and the second inverter is reset by the following $\phi_2$ clock. The selected READ WL is brought high by the same $\phi_2$ clock that resets the second inverter. The READ WL turns on the cell transistors N1.

If the capacitor has a high charge, transistor N2 is in the on state, which causes the bit line BL to be pulled low. During $\phi_2$ transistors N4 and N5 in the amplifier 1503 are also turned on. N4 is a weak transistor, serving as a pullup load in case the cell capacitor is in a low charge state. However, with a high charge on the cell capacitor, the gates of transistors P1 and N6 are pulled to close to ground level and remain at this level when the gates of N4 and N5 are returned to ground at the end of a signal $\phi_2$xDATALD*. At the next $\phi_1$ the output of the inverter 1505, formed by transistors P1 and N6, is connected to the bit line via transistor N7.

With a short delay after $\phi_1$ (to permit the bit line to change state), RESTORE WL is brought high via NOR 1507 and connects the bit line to the storage capacitor C via transistor N3 storing a high or low, as appropriate.

When data are written into a selected row, the content of the DATA IN shift register is similarly applied to the input of the amplifier inverter by the signal $\phi_2$xDATALD.

The supply voltage for most signals is the regular $V_{dd}$, but in order to get the lowest impedance and highest speed on the circuits controlled by the cell capacitors some of the circuits are connected to a pumped supply $V_{dd}+$. This supply, which will be described later, delivers approximately 8 volts when $V_{dd}=5$ volts. The inverter in the amplifier and the NOR driving the restore word line are supplied by $V_{dd}+$. The $\phi_1$ signal that is applied to the gate of N7 is also at $V_{dd}+$ level. The high voltage on the storage capacitor will therefore be one N- channel threshold below $V_{dd}+$ or approximately 7 volt. Optionally, bootstrapping can be added to the signal on the gate of N7 and on the RESTORE WL.

C. Four Phase/Floating Bit Line Embodiment

Figure 16A:
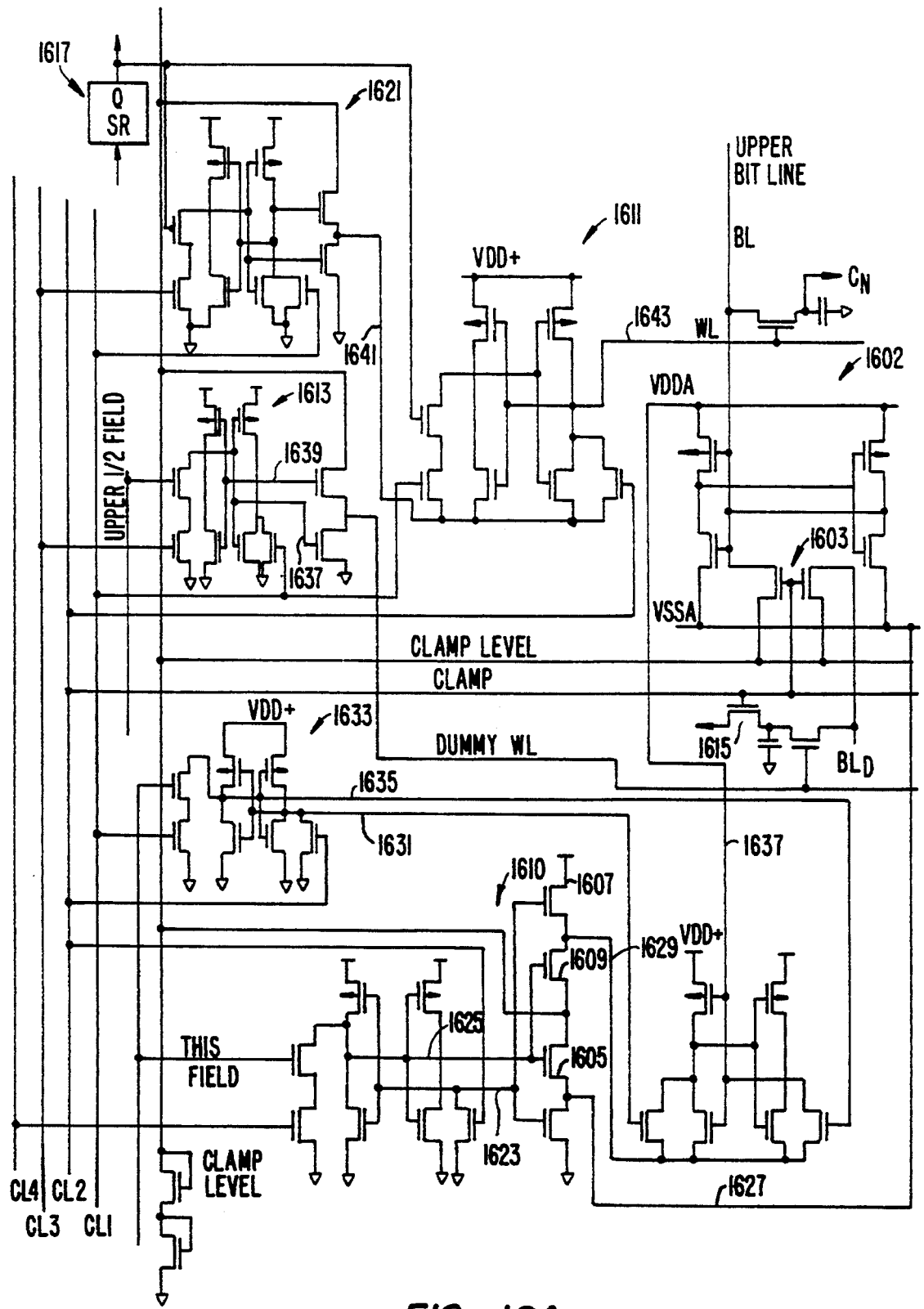
FIGS. 16A and 16B illustrate an alternative embodiment of the invention.
Figure 16B:
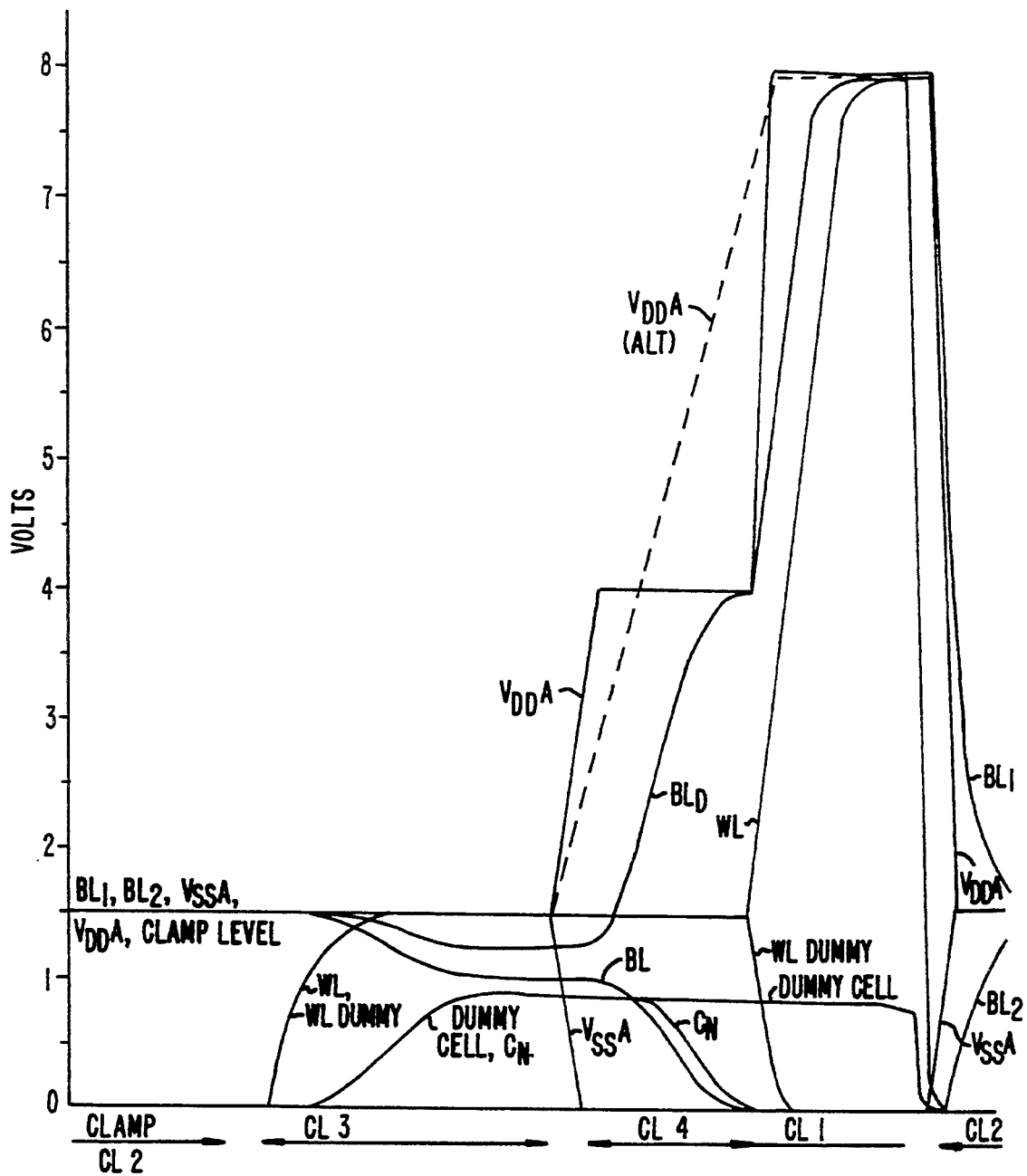

FIGS. 16A to 16B illustrate another alternative embodiment of the invention. IN particular, FIG. 16A illustrates the relevant portions of a four-phase circuit, FIG. 16B illustrates the relevant signals in the circuit on a timing diagram. One important feature illustrated by way of the circuit shown in FIG. 16 is that the bit lines are clamped and then left to float during initial sensing with both the high ($V_{dd}$A) and low ($V_{ss}$A) supplies to the sense amplifier 1602 left at a clamp voltage (e.g., 1.5 v) during initial sensing.

UPPER HALF FIELD is the output from flip-flop, which is set when the address shift register reaches the first position in the upper field. This field is true when this field is addressed and remains set until the address shifts out the UPPER FIELD. The signal CLAMP LEVEL is at about 1.5 v. Clocks CL1-CL4 are high (5 v) during the times indicated at the bottom of the timing diagram (FIG. 16B). CL2 also serves as the CLAMP signal.

CLAMP sets the bit lines BL1 and BL2 at this same voltage via clamping transistors 1603. During this time, the high and low voltage supplies to the sense amplifier are also set to the CLAMP LEVEL. The low voltage supply is set to CLAMP LEVEL since transistor 1605 is on. CL2 resets three flip-flops in the circuit. This brings nodes 1623, 1631 and 1643 low, and 1625 and 1635 high. With 1625 high, nodes 1629 and 1627 are connected to the CLAMP LEVEL via transistors 1609 and 1605. Node 1627 is $V_{ss}$A, which supplies the sources of the amplifiers N-channel transistors, which are now at about 1.5 v.

With node 1635 high, node 1637 ($V_{dd}$A) is also at 1.5 v. The CLAMP signal (CL2) turns on transistors 1603 also bringing both bit lines BL and BL$_d$ to 1.5 v. The CLAMP also turns on transistor 1615, discharging the DUMMY capacitor to ground.

The DUMMY WL and WL are both at ground level during CL2, because 1641 was brought low and 1637 was brought high by the previous CL1. CL2 pulls node 1643 (WL) low.

During CL3, both the selected word line WL and the dummy word line for the UPPER HALF FIELD DUMMY WL are brought to 1.5 v via circuits 1621 (WL connected to 1641) and 1613, respectively. A low value stored in the memory cell is illustrated in FIG. 16B and, accordingly, the bit line BL is brought down significantly (due to the relatively large capacitance of the memory cell and the low value stored therein). Since a low value is stored in all dummy memory cells, the voltage of the dummy bit line BL$_D$ is also brought down, although not as low due to the relatively smaller capacitance of the dummy memory cell. An important feature is that, with the voltage on WL during CL3 and CL4 at the CLAMP LEVEL, the voltage on CN should never be higher than CLAMP LEVEL minus the threshold voltage on the selected transistor. This means that even if CN is small relative to the bit line capacitance, the disturbance on CN will barely reach the threshold level on the circuits controlled by CN. On the other hand, if CN is larger than the bit line capacitance, then the disturbance will be less than the threshold level on the controlled circuits.

CL4 changes the state of nodes 1623 and 1625 bringing V$_{ss}$A to ground and V$_{dd}$A high to about 4 v via transistor 1607. The WL and DUMMY WL both remain at 1.5 v during CL4. The application of power on the amplifier causes the bit lines to switch in the relative direction preconditioned by the earlier displacement. BL will be pulled to ground, bringing CN along and BL$_d$ goes to 4 volt, while the dummy cell voltage remains at 0.7 v. CL4 according to one embodiment is relatively longer than the other clocks to permit complete switching of the high going bit line, while V$_{dd}$A at 4 v.

Thereafter, during CL1, the supply V$_{dd}$A is switched to V$_{dd}$+ (8 v), pulling the high bit line up to V$_{dd}$+. CL1 brings node 1631 to V$_{dd}$+, which in turn brings node 1637 (V$_{dd}$A) to V$_{dd}$+. The word line is also brought to V$_{dd}$+ during CL1, but is preferably delayed enough relative to the positive going bitline so that a high storage node remains undisturbed. The dummy word line has already served its purpose during this time and may optionally be returned to ground at CL4. CL2 returns the word line to ground just before V$_{dd}$A is returned to the clamp level. As indicated in dashed lines, V$_{dd}$A may alternatively be brought up continuously over CL4 and CL1.

In more detail, the switching of the voltages described above is accomplished as follows. Circuit 1619 controls V$_{dd}$A and V$_{ss}$A levels for the amplifier in the selected field. Circuit 1613 controls the dummy line voltage. The address shift register 1617 together with the circuits 1621 and 1611 selects and drives the word line.

Circuit 1619 is active only when the field is selected. All non selected fields are in the clamp mode. CL2 applied to the circuit 1619 causes node 1623 to go to ground and node 1625 to go to V$_{dd}$. This connects V$_{ss}$A and node 1629 to the CLAMP LEVEL. CL2 also brings node 1631 of circuit 1633 to ground, toggling the high voltage latch, so that node 1635 goes to V$_{dd}$+.

The high node 1635 toggles the flip flop with node 1629 connected to V$_{ss}$, so that the node 1637, which is supplying V$_{dd}$ to the amplifier, is connected to the CLAMP LEVEL. When the field is selected CL4 pulls node 1625 in the circuit 1619 low, toggling node 1623 high. This connects node 1627 to ground and lifts node 1629 to one threshold below 5 v (about 4 v). Node 1635 is still at V$_{dd}$+, so node 1637 goes to 4 v. If the field is selected, CL1 will finally pull node 1635 low, making node 1639 high. This in turn toggles the latch for V$_{dd}$A, so that the node 1637 goes to V$_{dd}$+.

Circuit 1613 in the clamped mode, initiated by CL1, is holding the DUMMY WL at ground. With the UPPER HALF FIELD flip flop set (not shown) node 1637 is pulled low at CL3. This makes node 1639 high, connecting the DUMMY WL to the CLAMP LEVEL. Circuit 1621 functions similarly to circuit 1613 except that node 1641 is connected to the CLAMP LEVEL only when the associated address shift register position is set. Circuit 1611 is the latch, whose output, node 1643, is the word line. CL1 AND a set address shift register position brings node 1643 to the V$_{dd}$+ level, while following CL2 returns node 1643 to ground. During CL2 node 1643 remains at ground and will stay at this level until the address shift register returns to this position. The latches used to switch the V$_{ss}$A between ground and the CLAMP LEVEL of the different latches are used to make sure that one gate is turned off before the other is turned on. This prevents glitches on the CLAMP LEVEL voltage. Of course, a simpler arrangement may be used if more current drain in the circuit is acceptable.

V. Peripheral Circuits

A. Pump Circuit

Figure 17:
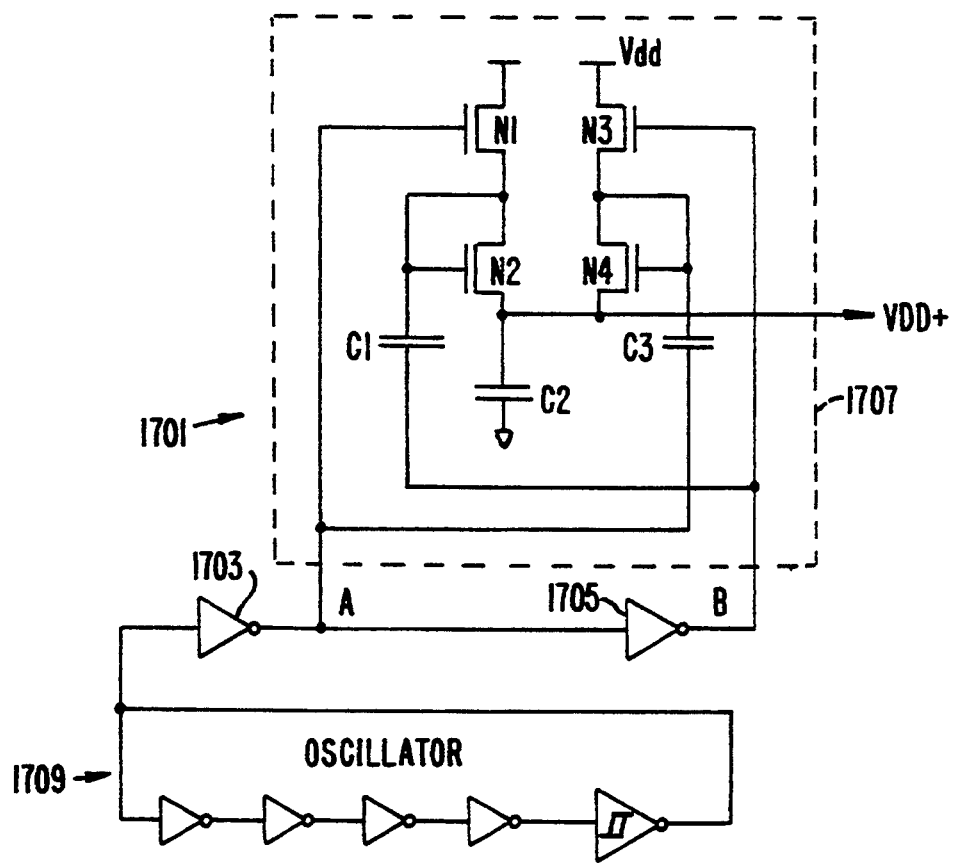
FIG. 17 illustrates a circuit for producing Vdd+.

FIG. 17 is a preferred pump circuit 1701 to provide the V$_{dd}$+ voltage. The goal of the design is to avoid any risks of charge injection into the substrate. The oscillator includes of three inverters 1703, 1705, and 1707 with the last (1707) being a Schmidt Trigger. The oscillating frequency generated by oscillator 1709 is relatively high, at least 100 MHz. Two powerful inverters 1703 and 1705 drive the pump circuit, which may or may not be symmetric. The symmetric configuration was chosen here to minimize the noise generation. The physical location of this circuit should be as close tot he power pins as possible.

The current requirement has two components. First a DC component to supply gates and inverters, that have inputs at V$_{dd}$ level and the P - channel devices connected to V$_{dd}$+. The transient current associated with changing word and bit lines must also be considered. Fortunately refresh cycles are very long, permitting long rise and fall times, so the AC component is very small. The size of capacitors C$_1$ and C$_3$ can be approximated by the formula I=2×C×DV×f, where DV is the voltage drop below the voltage at no load, and f is the frequency. Additional voltage drops are due to the transistors N1 through N4. These transistors should be large to minimize this voltage drop component. For a load current of 2 mA each capacitor C$_1$ and C$_3$ should be approximately 10 pF at 100 MHz. Capacitor C$_2$ can be smaller then the other two.

B. Bootstrap Circuit

Figure 18:
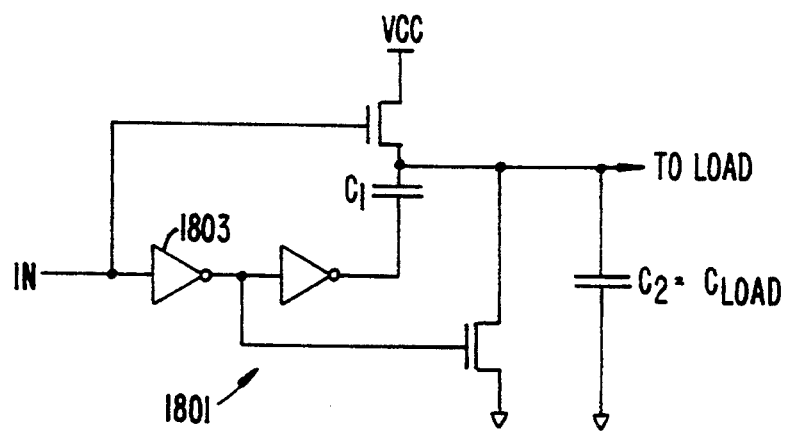
FIG. 18 illustrates a bootstrap circuit.

It was mentioned earlier that come signals (e.g., wordline and strobe) could benefit from bootstrapping. FIG. 18 shows a bootstrap circuit that is used according to one embodiment of the invention herein. The input IN is applied directly to the gate of a source follower 1801, which after a small delay in the first inverter 1803 lifts the output to approximately on threshold below the supply voltage. After a further delay through the second inverter 1805 the lower end of $C_1$ swings positive to the supply level.

A voltage of $V_{dd} \times C_1/(C_1+C_2)$ is therefore added to the first level. In most cases the load capacitance $C_2$ is quite large, requiring a large $C_1$. The source follower will also have to drive very large instantaneous current to precharge the output node. If a bootstrap circuit is used, when the circuit is supplied from a pump, very high peak currents must be avoided. A small source driver transistor must be used in combination with a long delay in the second inverter. The second inverter would in that case be replaced with a delay circuit. This delay circuit may be a gate utilizing some of the clocks in the dynamic control circuitry.

C. Secondary pump

Figure 19:
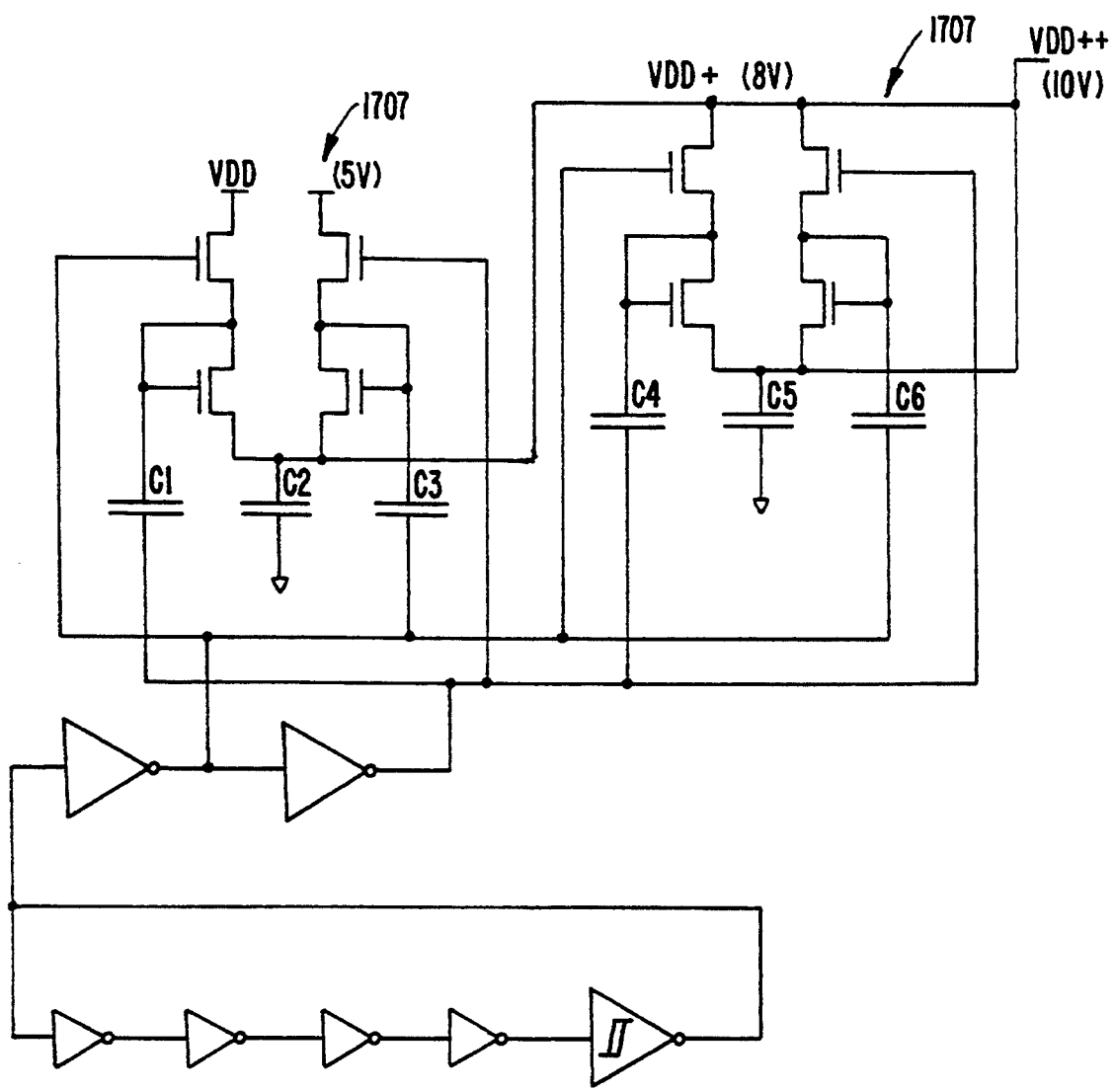
FIG. 19 illustrates a Vdd++ generation circuit.

In FIG. 19 the pump 1707 has been duplicated to generate a voltage, $V_{dd}++$, which is a few volts higher than the $V_{dd}+$ voltage, i.e., $V_{dd}++$. Using $V_{dd}++$ will permit the word line and transfer signals to go high enough to achieve gate control signals at $V_{dd}+$ levels without resorting to Bootstrap circuits.

Figure 20:
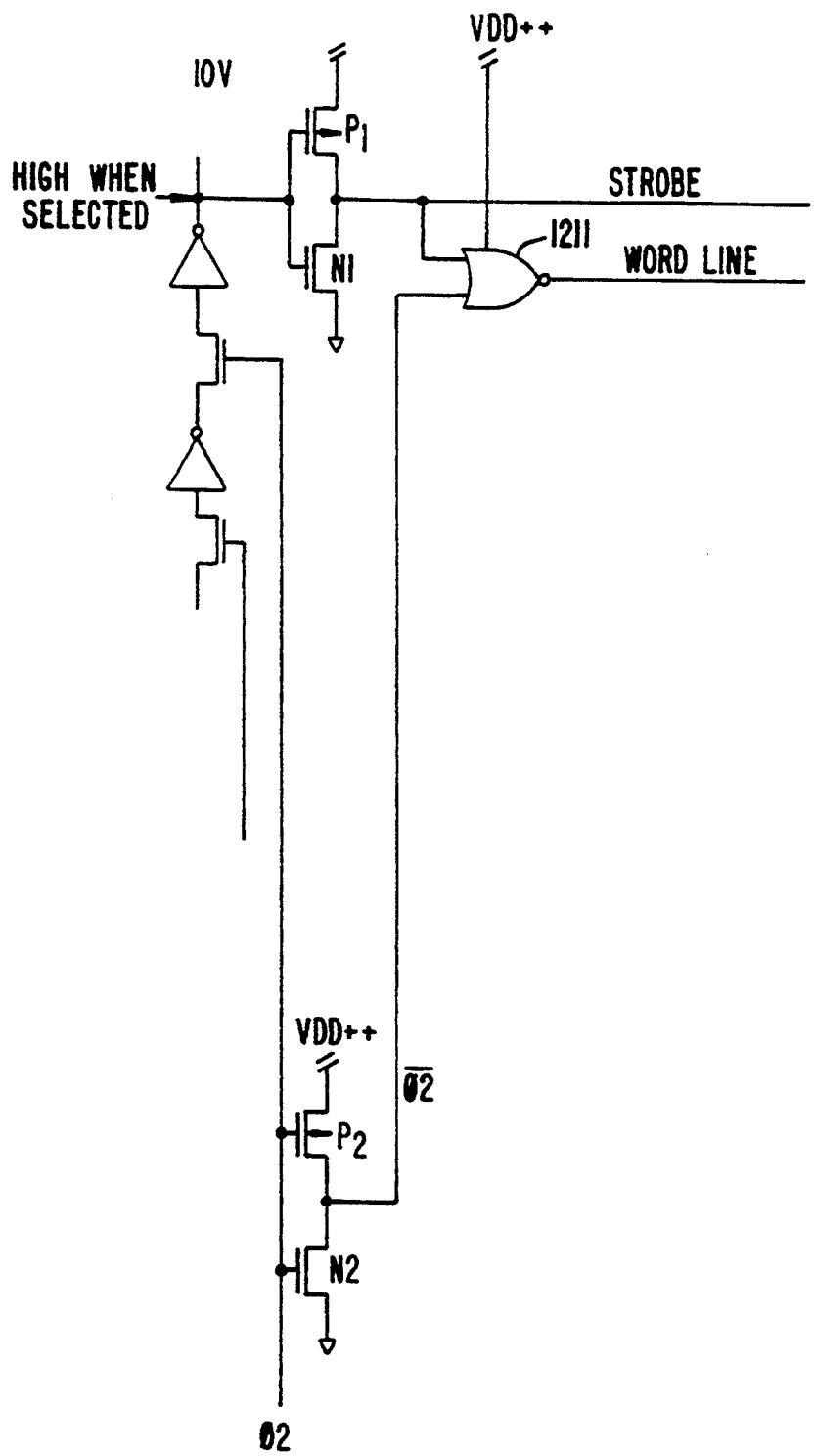
FIG. 20 illustrates a strobe using Vdd++.

FIG. 20 shows an alternative way to utilize the $V_{dd}++$ voltage. In FIG. 20 STROBE, which is supposed to go low when the word line is selected, is pulled down by transistor N1. P1 is still turned on with a gate voltage=$V_{dd}-V_{dd}++$ since the high shift register output is only at the $V_{dd}$ level. To minimize the associated current P1 is long and narrow. Fortunately no current is drawn by non-selected wordlines since N1 is then turned off and the strobe is pulled to the $V_{dd}++$ level.

The NAND gate connecting to the word line is supplied from $V_{dd}++$ and ground, so full CMOS performance results (no current in the on and off states). $\phi_2$ is generated by an inverter with P2 supplied from $V_{dd}++$, while the gate swings between $V_{dd}$ and ground. This is a single circuit common for all word lines, so allowance can be made for this current drain from $V_{dd}++$. A designer will need to balance between the need to make P1 and P2 small for minimum current and the rise time requirements on the lines to be driven.

VI. Signal/Noise Level Considerations

Minimizing the level of the momentary disturbance on the controlling memory capacitor is desirable in the above circuits. There is, however, a certain level of noise that is acceptable by the controlled circuit.

In one common type of multiplexer, one out of K incoming signals is routed through N-channel transistors to one output. The selected transistor is fully turned on, with its gate at $V_{cc}$ level, which here is assumed to be 5 volts. The signal on the input of the selected transistor may be 5 volts if coming from a CMOS logic circuit, or 4 volts if coming from another multiplexer of the same type. In this case the selected transistor will with some delay output a signal at 4 volts, but the transistor will in the final state be barely turned on. One of the not selected transistors has an input level at 0 volt, but the gate is exposed to a refresh noise pulse of Vnoise peak amplitude=$2*V_{th}$ (1.4 v). If the threshold voltage for the selected transistor at 4 volt=1 volt and $V_T$ for the non-selected transistor=0.7 volt, the output would drop 1 volt to 3 volt. There are of course worse cases, where more than one non selected transistor with their inputs at ground all are refreshed at the same time. With 2 transistors pulling down under those conditions the voltage would drop approximately 1.5 volt to 2.5 volt and with 4 transistors pulling down, the drop would be 2 volt, bringing the output to 2 volt. The stated numbers are generally based on the equations applicable to MOS transistors.

If pumped voltages are used to bring the voltage on the control capacitors above $V_{dd}$, then the situation changes. With the control voltage at 7 volts, an incoming signal at 5 volt and one disturbing input would drop the output to 4.6 volt. Two disturbed signals as discussed above would drop the output to 4.3 volt and four disturbed inputs would drop the output to 3.8 volt.

In the discussion above, the assumption was made that the disturbance was much slower than the speed of the circuits that are controlled. With the attempts to make a fast amplifier, a noise pulse may actually be filtered in a multiplexer. It is also assumed that the disturbance on the controlling capacitors peaked at 0.7 volts above the threshold level of the controlled transistors. If the threshold voltage on the transistor is 0.7 volts, the peak would be at 1.4 volts. Disregarding the discharge contribution from the amplifier itself on the bitline and assuming that the cell capacitance equals the bitline capacitance, this would mean that the clamped voltage would equal 2.8 volt. By lowering the clamped voltage and making sure that the clamped voltage equals the potential at the switching point of the amplifier flip-flop, the disturbance level on the storage capacitor can be reduced. In the example above, reducing the clamp level to 2 volt would drop the noise peak to 1 volt. $(V_g - V_T)$ is then 0.3 volt compared to 0.7 volt before. This reduces the noise current to 18% of that in the example above.

Figure 21:
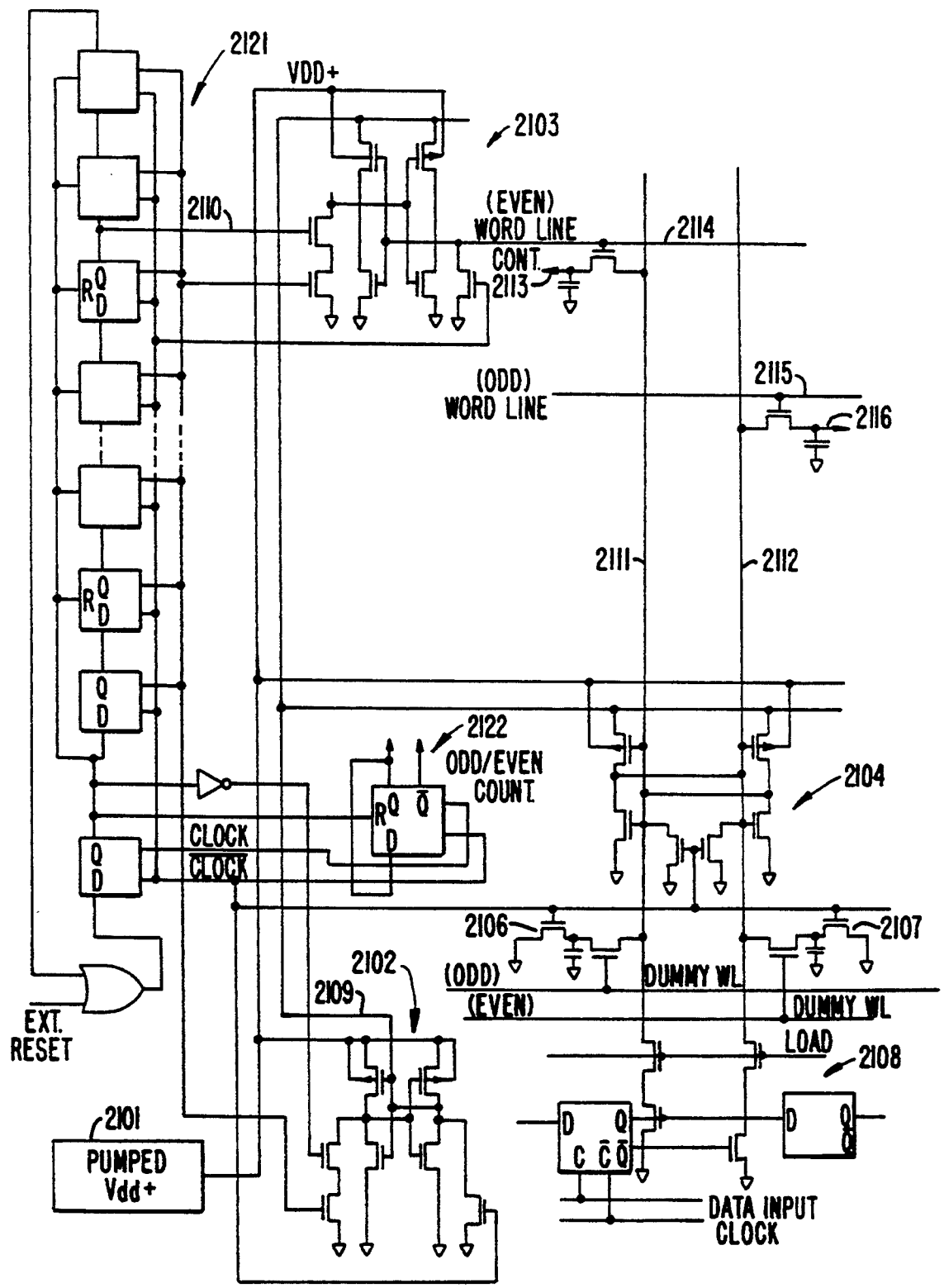
FIGS. 21 and 22 illustrate an alternative embodiment of the invention.

FIG. 21 shows partly in block form an alternative to the devices discussed above. A pump 2101 is continuously running and supplies power to N-wells associated with the high voltage latches 2103 and the $V_{dd}$ supply for latch 2102. Latch 2102 has an output 2109, that is low during clamp time and high during read time. Output 2109 supplies $V_{dd}$ for sense amplifiers 2104 and for word line select latches 2103. A recirculating shift register 2121 selects the word line to be used. The selected latch is set by the CLOCK signal and reset by its complement $\overline{\text{CLOCK}}$. Output 2109 of latch 2102 goes high on CLOCK for every selected word line and goes low for every $\overline{\text{CLOCK}}$. DUMMY WL is drive directly from the normal $V_{dd}$ (not shown in the figure). An ODD-/EVEN counter 2122 is used to selectively trigger the ODD or the EVEN dummy word line latch. A data input shift register 2108 is also shown.

The operation of the refresh cycle of the device in FIG. 21 is best further described in connection with FIG. 22. Clamping action takes place during $\overline{\text{CLOCK}}$. Node 2109 is low during $\overline{\text{CLOCK}}$, so the power is turned off to all high voltage latches and to the sense amplifiers. $\overline{\text{CLOCK}}$ also pulls all bit lines to ground.

Figure 22:
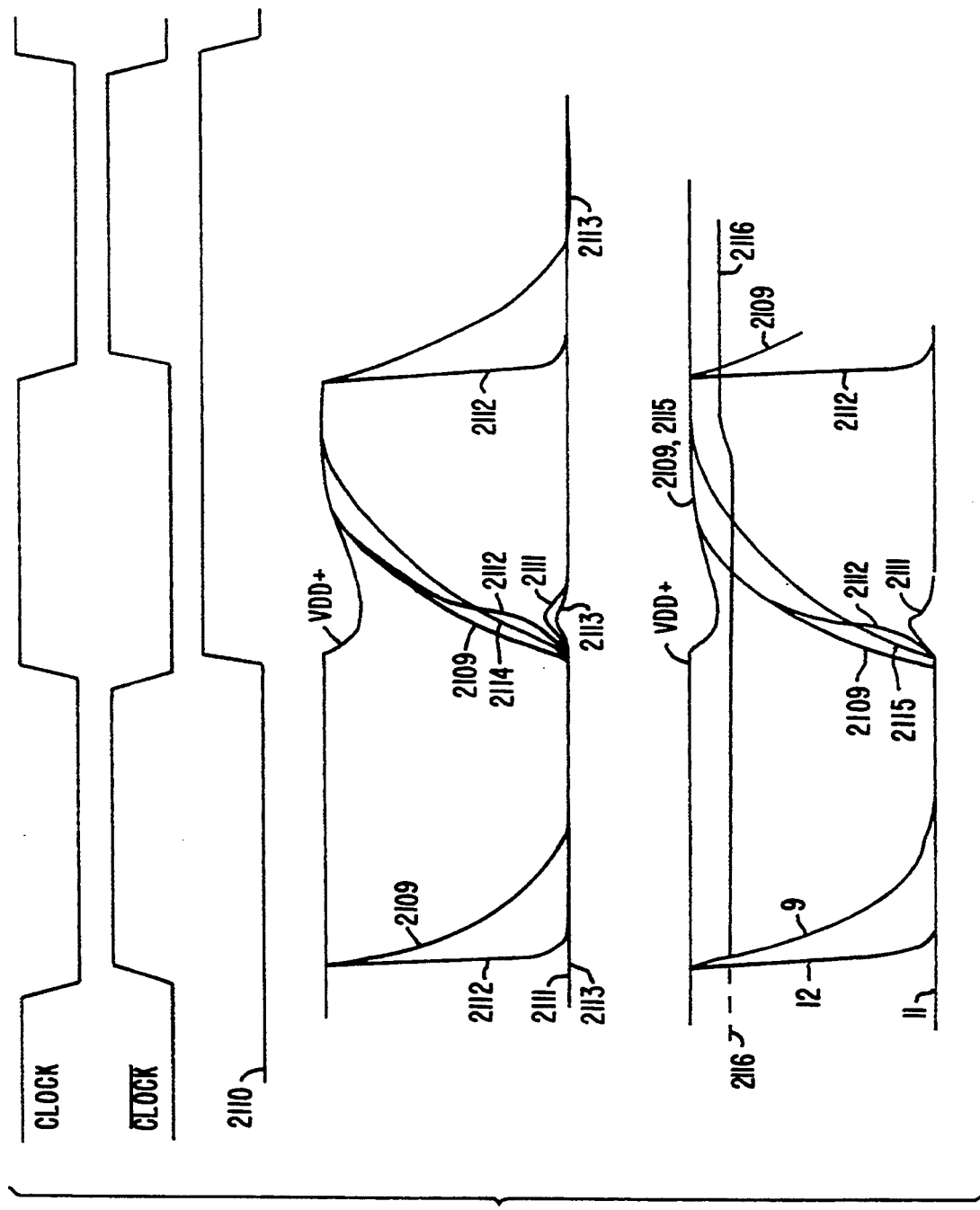

FIG. 22 shows two cases. In the first case, word line 2114 is selected and the associated bit 2113 is low. After the clamping, which brought both bit lines 2112 and 2111 to ground level, the CLOCK signal starts the read-refresh phase. Node 2109 goes high, but its rise time is controlled by careful selection of the P-channel transistor pulling up node 2109 in relation to the load imposed by the latches connected thereto. The word line 2114, which is very long and connects to a large number of cells, has a slower slope than node 2109. The dummy word lines DUMMY WL have about the same rise time as the word lines. In this case, node 2109 moves positive until the P-channel transistors are turned on. Nodes 2111 and 2112 are pulled up in parallel except for a slight difference caused by size differences between the P-channel transistors. When nodes 2111 and 2112 reach the threshold level of the N-channel transistors, the pullup of nodes 2111 and 2112 is slowed down. If the word line had not been made high, nodes 2111 and 2112 would have reached the level of the flip-flops switching point and stayed there until the slight unbalance had caused the flip-flop to flip to one side. The word line 2114 potential is, however, increasing concurrently with node 2109. As soon as 2114 reaches the threshold level, the transistor in the cell connects 2111 and the storage capacitor.

This slows node 2111 in relation to node 2112. As 2114 goes higher, the unbalancing current increases. When this current exceeds the build in unbalance of the flip-flop, the desired switching proceeds at an accelerated rate. The advantage of this approach is that at this relatively low voltage on node 2109, the current in the P-channel transistors is small and thereby the differential current is also small. The current from the storage capacitor need only overcome this small differential current.

The dummy word line (EVEN) goes positive at the same or slower rate than the word line. The dummy capacitor is only half as large as the storage capacitor, so the capacitor, so the capacitor at 2113 dominates.

In the second case, storage node 2116 is high, word line 2115 is selected and the ODD dummy word line is selected. The dummy capacitor in 2106 now holds back node 2111 and causes node 2112 to flip high. Node 2116 is disturbed only if 2115 at any time is more than one Vth above 2112. This could happen only if the slope of 2115 is very close to that of 2109. But even at that eventuality, the negative excursion of node 2116 would be minimal compared to the case without dummy capacitors. Any charge lost by capacitor 2116 due to leakage or the potential cause discussed above will be replaced at the time wordline 2115 reaches the $V_{dd}+$. The voltage will be ($V_{dd}+ - $Vth).

VII. Conclusion

The present invention provides an improved logic array device. The above description is illustrative and not restrictive. Many variations of the invention will become apparent to those of skill in the art upon review of this disclosure. Merely by way of example particular circuit configurations have been shown for operation of the device, but a wide variety of different circuits may be used in the implementation of the invention. The scope of the invention should, therefore, be determined not with reference to the above description, but instead should be determined with reference to the appended claims along with their full scope of equivalents.

What is claimed is:

1. A method of operating a dynamic memory comprising the steps of:

precharging a selected bit line in said dynamic memory to a selected value with a precharge circuit, said precharge circuit being selectively coupled to said bit line, said bit line being selectively coupled to a sense amplifier comprising a pull up portion coupled to a selectable high voltage source and a pull down portion coupled to a low voltage source;

decoupling said bit line from said precharge circuit, whereby said bit line floats;

coupling said bit line to a memory cell by bringing at least one word line to a first word line voltage level while applying a first high voltage to said pull up portion; and thereafter, applying a second, higher voltage to said pull up portion while raising a voltage on said at least one word line to a second, higher word line voltage level.

2. A method of operating a dynamic memory as recited in claim 1 wherein said word line is brought to said first word line voltage level and maintained at said first word line voltage level for a selected period of time.

3. A method of operating a dynamic memory as recited in claim 1 wherein said step of coupling said bit line to a memory cell further comprises the step of coupling another bit line to a dummy memory cell by applying said first word line voltage level to a dummy word line.

4. A method of operating a dynamic memory as recited in claim 3 further comprising the step of lowering a voltage applied to said dummy word line when said voltage on said at least one word line is raised.

5. A method of operating a dynamic memory as recited in claim 1 wherein said memory cell is coupled to a logic circuit with inputs and further comprising the step of inputting a voltage level in said memory cell for selecting a logic function performed by said logic circuit.

6. A method of operating a dynamic memory as recited in claim 1 wherein said step of precharging applies a voltage of about 1.5 v to said selected bit line.

7. A method of operating a dynamic memory as recited in claim 1 wherein said first word line voltage level is about 1.5 v and said second word line voltage level is about 7 v.

8. A method of operating a dynamic memory as recited in claim 1 further comprising the step of boosting a supply voltage level in said dynamic memory, and wherein:

said step of applying a second word line voltage level is a step of applying said boosted voltage level; and said step of applying a second, higher voltage level to said pull up portion is a step of applying said boosted voltage level.

9. A dynamic memory integrated circuit structure comprising:

a storage capacitor, a first plate of said storage capacitor coupled to a gate of an access transistor, a second plate of said storage capacitor coupled to a first terminal of said access transistor;

a read transistor, said read transistor having a first terminal coupled to a second terminal of said access transistor and second terminal coupled to a bit line;

a restore transistor, said restore transistor having a first terminal coupled to said bit line and a second terminal coupled to said first plate of said storage capacitor; and an inverter circuit having an input selectively coupled to said bit line and an output selectively coupled back to said bit line.

10. The dynamic memory as recited in claim 9 further comprising:

a first, restore word line coupled to a gate of said restore transistor; and a second, read word line coupled to a gate of said read transistor.

11. The dynamic memory as recited in claim 9 further comprising:

a control circuit for selectively coupling said bit line to an input of said inverter circuit at a first time during an operating cycle and coupling an output of said inverter circuit back to said bit line at a second time in an operating cycle.

12. The dynamic memory as recited in claim 11 wherein a gate of said read transistor is coupled to a control line for activation of said read transistor during said first time and a gate of said access transistor is coupled to an output of said inverter during said second time.

13. The dynamic memory as recited in claim 9 further comprising a weak pullup transistor coupled to said bit line, said weak pullup transistor pulling said bit line to a high level when said bit line is brought high by said storage capacitor, and leaving said bit line at a relatively lower level when said bit line is brought low by said storage capacitor.

14. The dynamic memory as recited in claim 9 wherein said first plate of said storage capacitor is a control node in a programmable logic device.

* * * * *